United States Patent
Reilly et al.

(10) Patent No.: US 6,956,422 B2
(45) Date of Patent: Oct. 18, 2005

(54) GENERATION AND MEASUREMENT OF TIMING DELAYS BY DIGITAL PHASE ERROR COMPENSATION

(75) Inventors: James P. Reilly, Bloomington, IN (US); Noah P. Christian, Bloomington, IN (US)

(73) Assignee: Indiana University Research and Technology Corporation, Indianapolis, IN (US)

(*) Notice: Subject to any disclaimer, the term of this patent is extended or adjusted under 35 U.S.C. 154(b) by 0 days.

(21) Appl. No.: 10/744,834

(22) Filed: Dec. 23, 2003

(65) Prior Publication Data

US 2004/0183517 A1 Sep. 23, 2004

Related U.S. Application Data

(60) Provisional application No. 60/455,572, filed on Mar. 7, 2003.

(51) Int. Cl.⁷ .............................................. H03H 11/26
(52) U.S. Cl. ............................ 327/261; 702/79; 702/80
(58) Field of Search ................................ 327/261, 263, 327/291, 293, 294–298; 702/79, 80, 89

(56) References Cited

U.S. PATENT DOCUMENTS

| | | | |
|---|---|---|---|
| 3,737,766 A | 6/1973 | Lubarsky, Jr. ............... 324/622 |
| 4,604,717 A | 8/1986 | Kaplan ........................ 702/79 |
| 4,742,331 A | 5/1988 | Barrow et al. ............... 341/152 |
| 5,517,251 A * | 5/1996 | Rector et al. ................ 348/476 |
| 5,648,725 A * | 7/1997 | Divljakovic et al. ........ 324/551 |
| 5,650,739 A | 7/1997 | Hui et al. .................... 327/262 |
| 5,942,902 A | 8/1999 | Okayasu ...................... 324/617 |
| 6,097,755 A * | 8/2000 | Guenther et al. ........... 375/228 |
| 6,122,602 A * | 9/2000 | Michalski et al. .......... 702/159 |
| 6,400,202 B1 | 6/2002 | Fifield et al. ............... 327/291 |
| 6,460,001 B1 | 10/2002 | Yamaguchi et al. .......... 702/69 |

OTHER PUBLICATIONS

H. Leopold et al.,"A Time–to–Voltage Converter for Accurate Measurements of Travel Time", "Proc. Current Developments of Microelectronics", Bad Hofgastein, 1999, pp. 35–38.

A. E. Stevens et al., "A Time–to–Voltage Converter and Analog Memory for Colliding Beam Detectors", *IEE Journal of Solid–State Circuits*, vol. 24, No. 6, 1989, pp. 1748–1752.

International Search Report for PCT Application No. PCT/US03/41267, May 13, 2004, 4 pgs.

* cited by examiner

*Primary Examiner*—Timothy P. Callahan
*Assistant Examiner*—An T. Luu
(74) *Attorney, Agent, or Firm*—Barnes & Thornburg LLP

(57) ABSTRACT

A circuit and method for generating a delayed event following a trigger pulse occurring at a random time between clock pulses is disclosed. The circuit includes a clock circuit, a voltage converter, an analog-to-digital converter circuit, a memory storage circuit, and a summing circuit. The method includes representing the time between the triggering pulse and a subsequent clock pulse as a voltage, converting the voltage to a stored digital value, and defining a desired delay time by adding a first time determined by counting a predetermined number of clock cycles to a second time determined by converting the stored digital value first to an analog value and then to a time value.

51 Claims, 21 Drawing Sheets

This application claims priority under 35 U.S.C. § 119(e) to U.S. Provisional Application Ser. No. 60/455,572, filed on Mar. 17, 2003, the disclosure of which is hereby incorporated by reference herein.

GENERATION AND MEASUREMENT OF TIMING DELAYS BY DIGITAL PHASE ERROR COMPENSATION

FIELD OF THE INVENTION

This invention relates generally to apparatus and methods for the generation of events following a trigger pulse. It is disclosed in the context of an electronic circuit and method for the generation of events following a trigger pulse when the trigger pulse occurs at an indeterminate time between clock pulses. However, it is believed to be useful in other applications as well.

BACKGROUND OF THE INVENTION

The generation of events following an input trigger pulse is a common requirement in electrical applications. Generally, a timing delay generator receives a trigger signal and counts pulses of an internally generated master clock to generate a known delay. When the trigger signal is received at a random time between the master clock pulses, there is inherent timing uncertainty. This timing uncertainty, commonly called jitter, is caused from the triggering event not being related in phase to the master clock. In particular, the timing uncertainty relates to the temporal difference between the trigger signal and the master clock pulse. Therefore, the timing uncertainty relates to the period of the master clock. As the frequency, or speed, of the master clock is increased, and its period proportionally reduced, the maximum timing uncertainty is reduced. However, increasing the speed of the master clock typically comes at the expense of increased circuit complexity and cost. Additionally, there are practical limits to the speed of a master clock. For example, in order to decrease the peak timing uncertainty to the picosecond order of magnitude, a master clock operating at one terahertz would be required. However, one terahertz clocks are not practical with currently available technology. Accordingly, there is a need for methods and apparatus for the generation of precision delays following trigger pulses which occur at random times between clock pulses.

DISCLOSURE OF THE INVENTION

According to an aspect of the invention, apparatus for generating a delayed event comprises a clock for producing regular clock pulses, a voltage converter for producing a voltage that is directly proportional to the difference between a triggering pulse and a clock pulse, an analog-to-digital converter for converting a voltage produced by the voltage converter to a digital value, and a summing circuit coupled to the analog-to-digital converter for producing a signal related to the sum of (i) a first time related to a predetermined number of clock pulses and (ii) a second time related to the digital value.

Illustratively according to this aspect of the invention, the voltage converter for producing a voltage that is directly proportional to the difference between a triggering pulse and a subsequent clock pulse comprises a voltage converter for producing a voltage that is directly proportional to the difference between a triggering pulse and a subsequent clock pulse.

Illustratively according to this aspect of the invention, the summing circuit coupled to the analog-to-digital converter for producing a signal related to the sum of (i) a first time related to a predetermined number of clock pulses and (ii) a second time related to the storable digital value comprises a summing circuit coupled to the analog-to-digital converter for producing a signal related to the sum of (i) a first time that is identifiable by counting a predetermined number of clock pulses and (ii) a second time related to the digital value.

Illustratively according to this aspect of the invention, the summing circuit coupled to the analog-to-digital converter for producing a signal related to the sum of (i) a first time related to a predetermined number of clock pulses and (ii) a second time related to the digital value comprises a summing circuit coupled to the analog-to-digital converter for producing a signal related to the sum of (i) a first time related to a predetermined number of clock pulses and (ii) a second time that is identifiable by converting the digital value to an analog value followed by converting the analog value to a time value Illustratively according to this aspect of the invention, the summing circuit coupled to the analog-to-digital converter for producing a signal related to the sum of (i) a first time related to a predetermined number of clock pulses and (ii) a second time related to the digital value comprises a summing circuit coupled to the analog-to-digital converter for producing a signal related to the sum of (i) a first time related to a predetermined number of clock pulses and (ii) a second time related to the phase error between a leading edge of a clock pulse and the triggering pulse.

Further illustratively according to this aspect of the invention, the apparatus includes a memory circuit coupled to the analog-to-digital converter and the summing circuit, the memory circuit having a memory register capable of storing the digital value.

Illustratively according to this aspect of the invention, the memory circuit comprises a field-programmable gate array.

Further illustratively according to this aspect of the invention, the apparatus includes a digital-to-analog converter for representing the digital value as an analog voltage, the digital-to-analog converter coupled to the memory circuit and the summing circuit.

Further illustratively according to this aspect of the invention, the apparatus includes a time converter coupled to the digital-to-analog converter for representing the analog voltage as a time value.

Illustratively according to this aspect of the invention, the time converter comprises a voltage ramp generator.

Illustratively according to this aspect of the invention, the voltage converter comprises a voltage ramp generator.

Illustratively according to this aspect of the invention, the voltage converter further comprises a sample-and-hold circuit, a voltage comparator, and a sampling amplifier.

Illustratively according to this aspect of the invention, the voltage converter further comprises a control circuit for controlling the quiescent current of the voltage ramp generator.

Illustratively according to this aspect of the invention, the summing circuit comprises a plurality of delay generator devices.

Illustratively according to this aspect of the invention, the summing circuit comprises a voltage ramp generator and a comparator, the comparator having a first input coupled to a reference voltage source and a second input coupled to an output of the voltage ramp generator.

Further illustratively according to this aspect of the invention, the apparatus comprises a field programmable gate array for identifying the first and the second times.

Further illustratively according to this aspect of the invention, the apparatus comprises a synchronization circuit coupled to the field programmable gate array for improving the synchronization of the outputs of the field programmable gate array.

Further illustratively according to this aspect of the invention, the apparatus comprises a logic converter circuit for converting a signal from a first logic family to a second logic family.

According to an aspect of the invention, a method for generating delayed events comprises representing the time between a triggering pulse and a subsequent clock pulse as a voltage, converting the voltage to a digital value, and defining a desired delay time following the triggering pulse by (i) identifying a first time and (ii) adding to the first time a second time determined by converting the digital value to an analog value and then converting the analog value to a time value.

Illustratively according to this aspect of the invention, identifying a first time comprises identifying a time determined by counting a predetermined number of clock cycles.

Illustratively according to this aspect of the invention, identifying a first time comprises retrieving a stored digital time value, the stored digital time value representing a predetermined number of clock cycles.

Illustratively according to this aspect of the invention, representing the time between a triggering pulse and a subsequent clock pulse as a voltage comprises initiating a ramp voltage for the duration of the time between the triggering pulse and the subsequent clock pulse.

Illustratively according to this aspect of the invention, converting the voltage to a stored digital value comprises (i) converting the voltage to a digital value and (ii) storing the digital value in a memory device.

Illustratively according to this aspect of the invention, converting the stored digital value first to an analog value and then to a time value comprises initiating a ramp voltage for a duration until the ramp voltage is substantially equal to the analog value.

Illustratively according to this aspect of the invention, initiating a ramp voltage for a duration until the ramp voltage is substantially equal to the analog value comprises holding the ramp voltage at a voltage substantially equal to the analog value.

Illustratively according to this aspect of the invention, holding the ramp voltage at a voltage substantially equal to the analog value comprises controlling the quiescent current of a ramp generator.

Illustratively according to this aspect of the invention, controlling the quiescent current of a ramp generator comprises reducing the quiescent current towards zero amps.

Further illustratively according to this aspect of the invention, the method comprises defining a desired pulse width by (i) identifying a third time and (ii) adding to the third time a fourth time determined by converting the stored digital value to an analog value and then converting the analog value to a time value.

Illustratively according to this aspect of the invention, identifying a third time comprises identifying a time determined by counting a predetermined number of clock cycles.

Illustratively according to this aspect of the invention, identifying a third time comprises retrieving a stored digital time value, the stored digital time value representing a predetermined number of clock cycles.

Further illustratively according to this aspect of the invention, the method comprises producing an output trigger event a duration after the trigger pulse, the duration being substantially equal to the desired delay time, the output trigger event having a duration substantially equal to the desired pulse width.

Further illustratively according to this aspect of the invention, the method comprises converting the stored digital value to a leading edge value.

Illustratively according to this aspect of the invention, converting the stored digital value to a leading edge value comprises converting the stored digital value to a first time value, calculating a difference of a period of a master clock and the first time value, and converting the difference to a digital value.

According to an aspect of the invention, apparatus for generating a delayed event comprises first means for producing regular clock pulses, second means for producing a voltage that is directly proportional to the difference between a triggering pulse and a clock pulse, third means for converting a voltage produced by the second means to a digital value, and fourth means for producing a signal related to the sum of (i) a first time related to a predetermined number of clock pulses and (ii) a second time related to the digital value, the fourth means coupled to the third means.

Illustratively according to this aspect of the invention, the second means comprises second means for producing a voltage that is directly proportional to the difference between a triggering pulse and a subsequent clock pulse.

Illustratively according to this aspect of the invention, the fourth means for producing a signal related to the sum of (i) a first time related to a predetermined number of clock pulses and (ii) a second time related to the digital value comprises fourth means for producing a signal related to the sum of (i) a first time that is identifiable by counting a predetermined number of clock pulses and (ii) a second time related to the digital value.

Illustratively according to this aspect of the invention, the fourth means for producing a signal related to the sum of (i) a first time related to a predetermined number of clock pulses and (ii) a second time related to the storable digital value comprises fourth means for producing a signal related to the sum of (i) a first time related to a predetermined number of clock pulses and (ii) a second time that is identifiable by converting the digital value to an analog value and then converting the analog value to a time value.

Illustratively according to this aspect of the invention, the fourth means for producing a signal related to the sum of (i) a first time related to a predetermined number of clock pulses and (ii) a second time related to the storable digital value comprises fourth means for producing a signal related to the sum of (i) a first time related to a predetermined number of clock pulses and (ii) a second time related to the phase error between a leading edge of a clock pulse and the triggering pulse.

Further illustratively according to this aspect of the invention, the apparatus includes fifth means for storing the digital value, the fifth means including a memory register, the fifth means coupled to the third means and the fourth means.

Illustratively according to this aspect of the invention, the fifth means comprises a field-programmable gate array.

Further illustratively according to this aspect of the invention, the apparatus includes sixth means for representing the digital value as an analog voltage, the sixth means coupled to the fourth means and the fifth means.

Further illustratively according to this aspect of the invention, the apparatus includes seventh means for representing the analog voltage as a time value, the seventh means coupled to the sixth means.

Illustratively according to this aspect of the invention, the seventh means comprises a voltage ramp generator.

Illustratively according to this aspect of the invention, the second means comprises a voltage ramp generator.

Illustratively according to this aspect of the invention, the second means further comprises a sample-and-hold circuit, a voltage comparator, and a sampling amplifier.

Illustratively according to this aspect of the invention, the second means further comprises a control circuit for controlling the quiescent current of the voltage ramp generator.

Illustratively according to this aspect of the invention, the fourth means comprises a plurality of delay generator devices.

Illustratively according to this aspect of the invention, the fourth means comprises a voltage ramp generator and a comparator, the comparator having a first input coupled to a reference voltage source and a second input coupled to an output of the voltage ramp generator.

Further illustratively according to this aspect of the invention, the apparatus comprises a field programmable gate array for identifying the first and the second times.

Further illustratively according to this aspect of the invention, the apparatus comprises a synchronization circuit coupled to the field programmable gate array for improving the synchronization of the outputs of the field programmable gate array.

Further illustratively according to this aspect of the invention, the apparatus comprises fifth means for converting a signal from a first logic family to a second logic family.

According to an aspect of the invention, a method for measuring a time between two trigger events comprises initiating a first ramp voltage for the duration of a time between a first trigger event and a subsequent clock pulse, initiating a time counter contemporaneously with the end of the first ramp voltage, initiating a second ramp voltage for the duration of a time between a second trigger event and a subsequent clock pulse, terminating the time counter contemporaneously with the end of the second ramp voltage, and calculating the delay between the first trigger event and the second trigger event.

Further illustratively according to this aspect of the invention, the method further comprises converting a peak voltage of the first ramp voltage to a first time value and converting a peak voltage of the second ramp voltage to a second time value.

Illustratively according to this aspect of the invention, calculating the delay between the first trigger event and the second trigger event comprises converting a peak voltage of the first ramp voltage to a first time value, converting a peak voltage of the second ramp voltage to a second time value, summing the first time value with the time counter, and subtracting the second time value from the time counter.

According to an aspect of the invention, a method for self-calibrating a delay measurement and generation circuit comprises initiating a first voltage ramp for about one clock cycle, storing a first peak voltage of the first voltage ramp, initiating a second voltage ramp for about two clock cycles, storing a second peak voltage of the second voltage ramp, calculating the slope and intercept of a voltage-to-time line including the first and second peak voltages.

Illustratively according to this aspect of the invention, storing a first peak voltage of the first voltage ramp comprises sampling and holding the voltage ramp after about one clock cycle.

Illustratively according to this aspect of the invention, storing a second peak voltage of the second voltage ramp comprises sampling and holding the voltage ramp after about one clock cycle.

Illustratively according to this aspect of the invention, storing a first peak voltage of the first voltage ramp comprises converting the first peak voltage to a first digital value and subsequently storing the first digital value in a memory location.

Illustratively according to this aspect of the invention, storing a second peak voltage of the second voltage ramp comprises converting the second peak voltage to a second digital value and subsequently storing the second digital value in a memory location.

Further illustratively according to this aspect of the invention, the method further comprises storing the slope and intercept of the voltage-to-time line in a memory location.

BRIEF DESCRIPTION OF THE DRAWINGS

The invention may best be understood by referring to the following detailed description and accompanying drawings which illustrate the invention. In the drawings.

DETAILED DESCRIPTIONS OF ILLUSTRATIVE EMBODIMENTS

Figure 1:
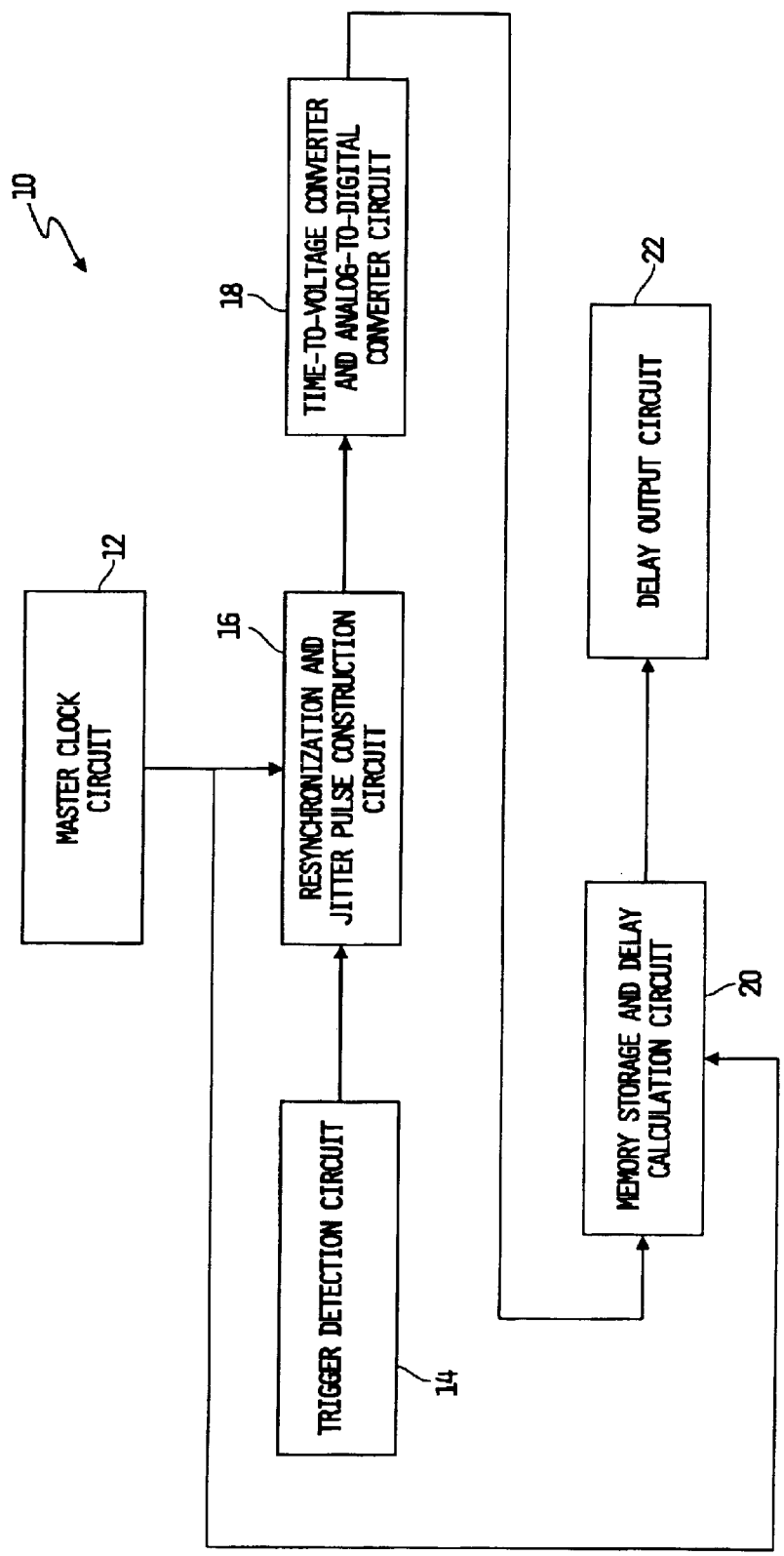
FIG. 1 illustrates a greatly simplified block diagram of a circuit constructed according to the disclosure.

While the disclosure is susceptible to various modifications and alternative forms, specific embodiments thereof have been shown by way of example in the drawings and will herein be described in detail. It should be understood, however, that there is no intent to limit the disclosure to the particular forms disclosed, but on the contrary, the disclosure is to cover all modifications, equivalents, and alternatives falling within the spirit and scope of the disclosure as defined by the appended claims.

In the detailed descriptions that follow, several integrated circuits and other components are identified, with particular circuit types and sources. In many cases, terminal names and pin numbers for these specifically identified circuit types and sources are noted. This should not be interpreted to mean that the identified circuits are the only circuits available from the same, or any other, sources that will perform the described functions. Other circuits are typically available from the same, and other, sources which will perform the described functions. The terminal names and pin numbers of such other circuits may or may not be the same as those indicated for the specific circuits identified in this description of illustrative embodiments.

Referring now to FIG. 1, an illustrative circuit 10 generates delayed output events (e.g., output trigger pulses after a delay time) after a trigger pulse which occurs at a random time relative to an internal pulse from a master clock. Circuit 10 includes a master clock circuit 12, a trigger detection circuit 14, a resynchronization and jitter pulse construction circuit 16, a time-to-voltage converter (hereinafter sometimes TVC) and analog-to-digital converter (hereinafter sometimes ADC) circuit 18, a memory storage and delay calculation circuit 20, and a delay output circuit 22. The master clock circuit 12 produces regular clock pulses which are received by circuits 16 and 20. The trigger detection circuit 14 detects the occurrence of a trigger event or pulse and produces a trigger signal corresponding to the trigger event. The resynchronization and jitter pulse construction circuit 16 receives the trigger signal and constructs a trigger jitter pulse corresponding to the trigger pulse and a subsequent clock edge. The TVC and ADC circuit 18 converts the trigger jitter pulse to a digital value and the memory storage and delay calculation circuit 20 stores the digital value. The circuit 20 also calculates the final delay time which, in some embodiments, may include summing the digital value with a predetermined arbitrary delay time. Additionally, in some embodiments, the circuit 20 calculates an arbitrary output pulse width. The delay output circuit 22 communicates with circuit 20 to produce an output pulse after the expiration of the appropriate delay time having a pulse width substantially equal to the arbitrary output pulse width.

Only one of many possible embodiments of the present disclosure is shown illustratively in FIG. 1. In other embodiments, the functionality of the circuits 12, 14, 16, 18, 20, and 22 may be otherwise divided. For example, the functionality of circuit 18 can be provided by separate time-to-voltage converter and analog-to-digital converter circuits. In other embodiments, the functionality of two or more of the circuits 12, 14, 16, 18, 20, and 22 may be combined into a single circuit. For example, the functions of circuits 12 and 14 can be combined into a single trigger detection, resynchronization, and jitter pulse construction circuit. Further, although only one illustrative delay output circuit 22 is shown and described herein, it is contemplated that alternative embodiments of circuit 10 may include any number of delay output circuits 22 to thereby increase the number of output channels of the circuit 10. Additionally, the functionality of the complete circuit 10, or a portion thereof, may be implemented in a single or multiple integrated chip(s). The circuit illustrated in FIG. 1 may also be included as a component of a larger circuit.

The circuit 10 may be implemented using any one or more of a number of control logics. The illustrative circuit 10 described hereinafter use a combination of positive emitter coupled logic (hereinafter sometimes PECL) having a logic high level value of approximately 4.0 volts and a logic low level value of approximately 3.25 volts, negative emitter coupled logic (hereinafter sometimes NECL) having a logic high level value of approximately −0.8 volts and a logic low level value of approximately −1.75 volts, transistor-transistor logic (hereinafter sometimes TTL) having a logic high level value of approximately 5 volts and a logic low level value of approximately 0 volts, and complimentary metal-oxide semiconductor (hereinafter sometimes CMOS) logic. However, in alternative embodiments, circuit 10 may be implemented using any single logic family including other logic families such as, for example, low voltage differential signal (hereinafter sometimes LVDS) logic, or any combination of logic families as desired in the particular implementation.

Figure 2A:
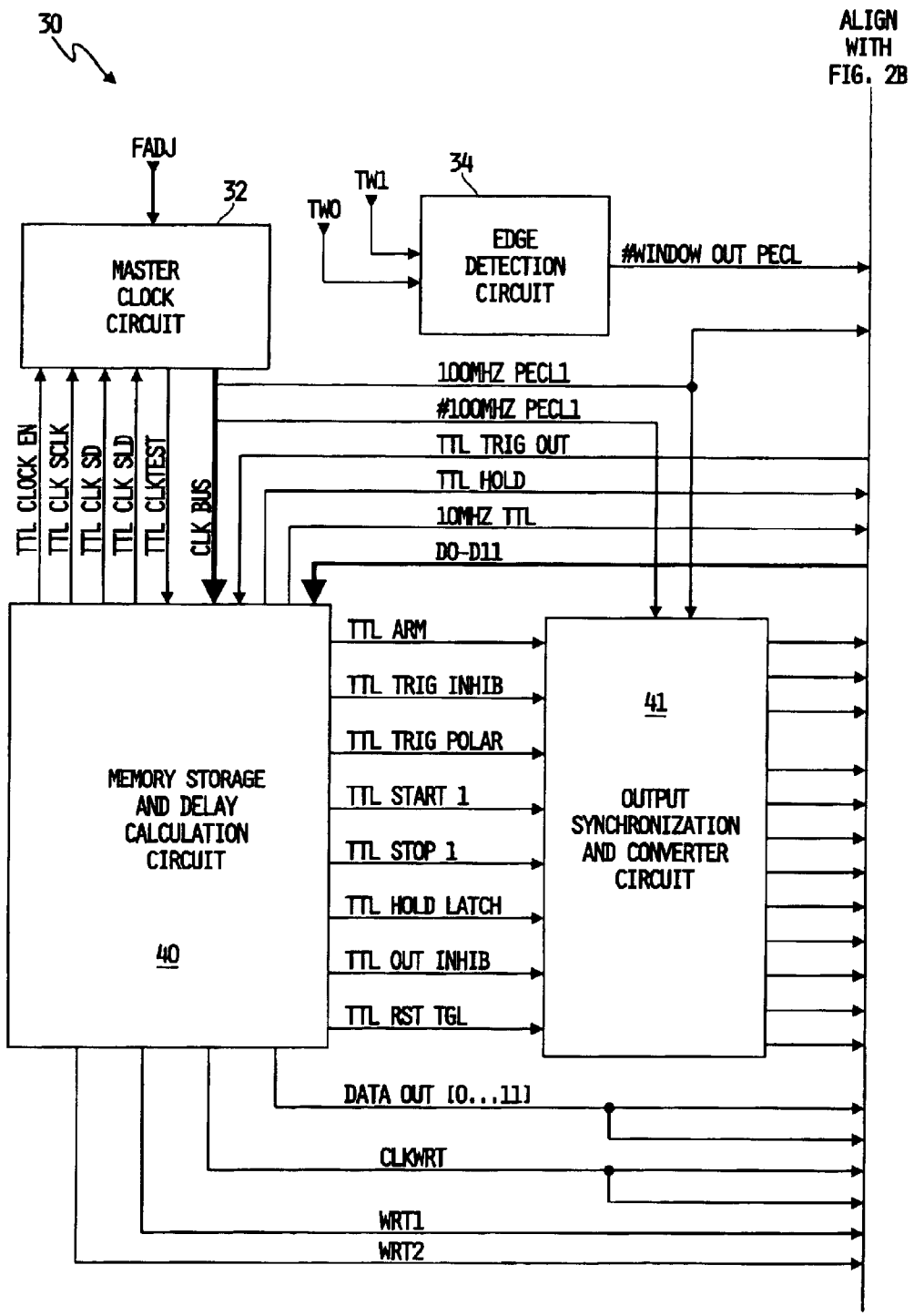
FIG. 2. illustrates a block diagram of one embodiment of a circuit constructed according to the disclosure.
Figure 2B:
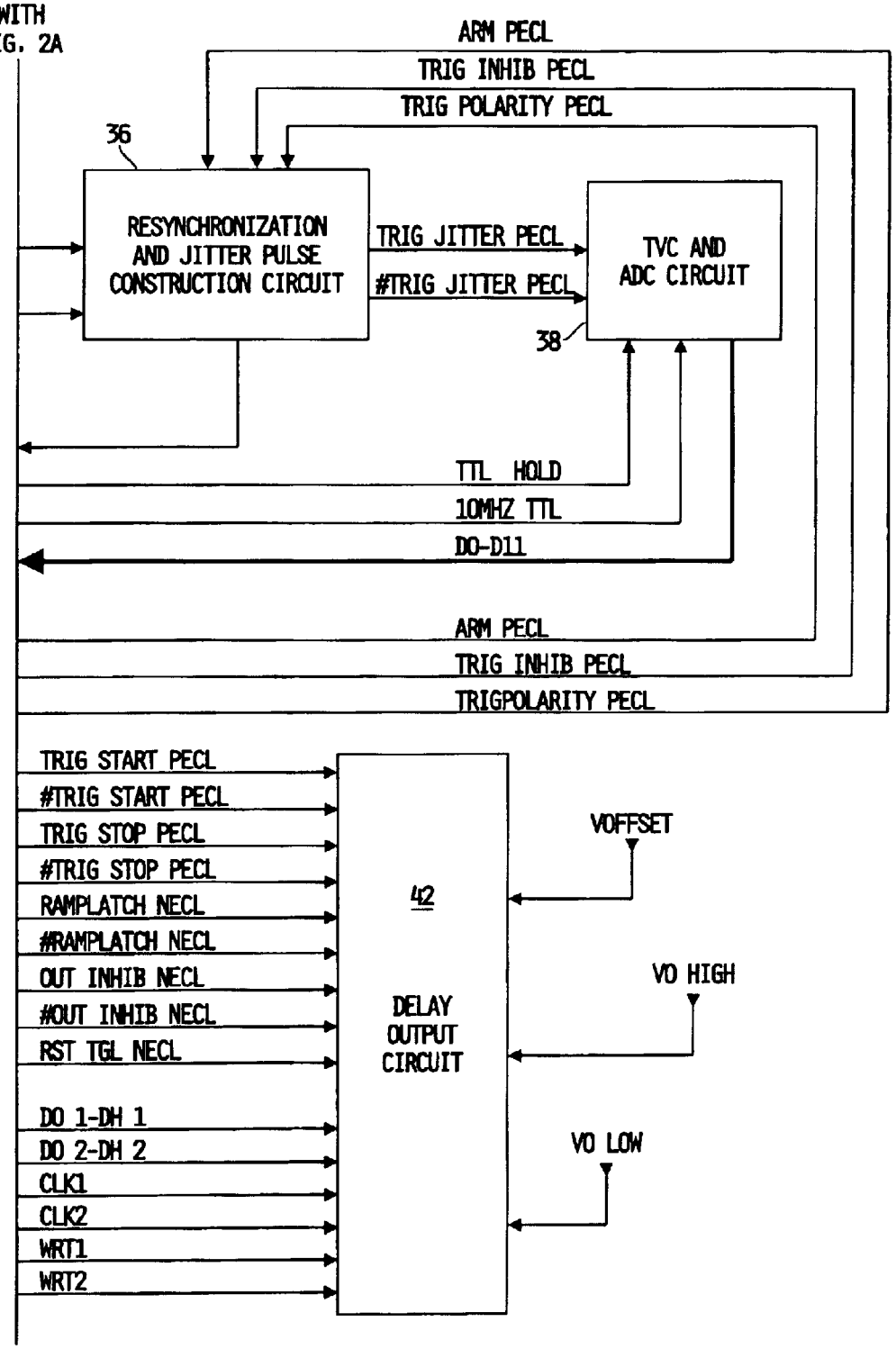

One illustrative embodiment of circuit 10 is shown in FIG. 2. A circuit 30 for generating events after a pulse which occurs at a random time relative to an internal pulse from a master clock includes a master clock circuit 32, a trigger detection circuit 34, a resynchronization and jitter pulse construction circuit 36, a time-to-voltage converter (hereinafter sometimes TVC) and analog-to-digital converter (hereinafter sometimes ADC) circuit 38, a memory storage and delay calculation circuit 40, an output synchronization and converter circuit 41, and a delay output circuit 42.

Figure 3:
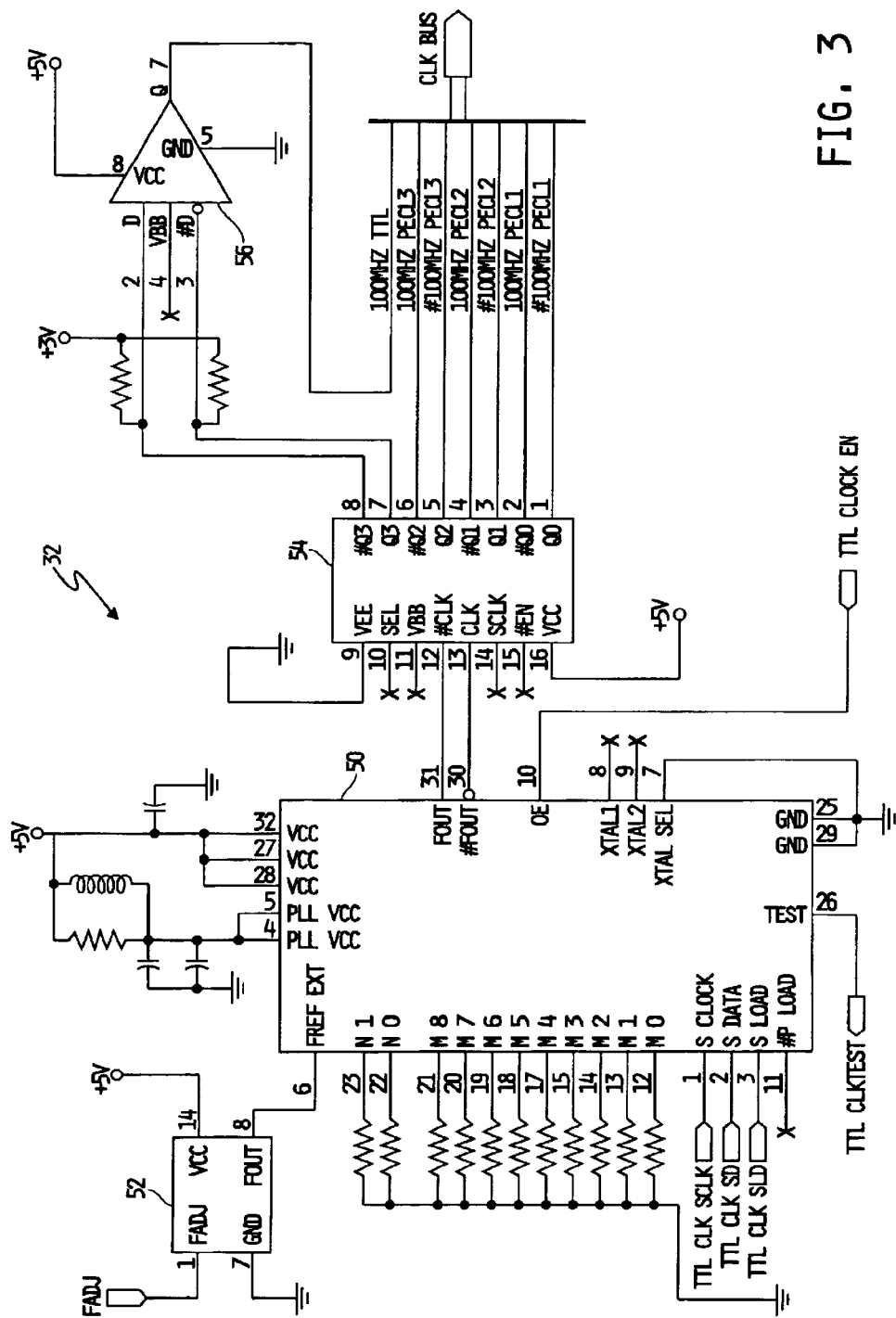
FIG. 3 illustrates a master clock circuit of the circuit illustrated in FIG. 2.

Referring now to FIGS. 2 and 3, the master clock circuit 32 is electrically coupled to circuits 36, 40, and 41. The master clock circuit 32 generates clock pulses which are received by circuits 36, 40, and 41. In the illustrative embodiment, the master clock 32 produces regular square wave clock pulses. However, other types of regular clock pulses may be generated. Clock circuits for the generation of regular clock pulses are widely known to those skilled in the art. In the illustrative embodiment of FIG. 3, PECL regular clock pulses are produced by a clock generator 50, illustratively an On Semiconductor type NBC 12430/LQFP 3.3V/5V Programmable PLL Synthesized Clock Generator. A number of control signals, TTL_CLK_SCLK, TTL_CLK_SD, TTL_CLK_SLD, are used to program the functions (e.g., clock frequency) of the clock generator 50. In the illustrative circuit 30, the CLK_SCLK, TTL_CLK_SD, TTL_CLK_SLD signal lines are coupled to the memory storage and delay calculation circuit 40 which is configured to produce the appropriate control signals. However, in other embodiments, the control signals may be produced via a separate control circuit or the like. The functions of the clock generator 50 may be monitored by monitoring a clock test signal, TTL_CLKTEST. For example, in the illustrative embodiment of circuit 30, the TTL_CLK_TEST signal line is coupled to the circuit 40 which is configured to perform the monitoring functions. Additionally, the output of the clock generator 30 is controllable by a clock enable signal, TTL_CLOCK_EN, received on an output enable terminal, OE, of the generator 50. In the illustrative embodiment of FIG. 3, the TTL_CLOCK_EN signal line is coupled to the circuit 30 which is configured to produce the appropriate clock enable signal.

The frequency of the clock generator 50 is determined, in part, by a crystal oscillator 52. The oscillator 52 is a temperature or "oven" compensated crystal oscillator, but other types of oscillators may be used. Illustratively, the oscillator 52 is an ILSI America type VCTCXO I302 Series DIP Clipped Sinewave oscillator. An FOUT terminal of the oscillator 52 is coupled to an FREF_EXT terminal of the clock generator 50. An Fadj terminal of the oscillator 32 is coupled to an FADJ signal line. The FADJ signal is used to control the operation (e.g., the oscillating frequency) of the oscillator 52.

The clock generator 50 is also coupled to a clock distribution device 54. In the illustrated embodiment of FIG. 3, the clock distribution device 54 is an ON Semiconductor type MC100EL15 5V ECL 1:4 Clock Distribution Chip. The input terminals, #CLK and CLK, of the distribution device 54 are coupled to the output terminals, #FOUT and FOUT, respectively, of the clock generator 50. The distribution device 54 distributes the clock signal across four outputs (or more outputs in embodiments using a distribution device having additional distribution outputs). Three sets of outputs of the device 54, Q0 and #Q0, Q1 and #Q1, and Q2 and #Q2, are coupled to the 100 MHZ_PECL1 signal lines, 100 MHZ_PECL2 signal lines, and the 100 MHZ_PECL3 signal lines, respectively. The fourth set of outputs, Q3 and #Q3, are coupled to a translator 56, illustratively an ON Semiconductor type MC100ELT21 5V Differential PECL to TTL Translator. The translator 56 converts the PECL clock pulses produced on the output terminals Q3 and #Q3 of the device 54 to TTL clock pulses for use with devices requiring TTL logic. The output, Q, of the translator 56 is coupled to the 100 MHZ_TTL signal line. The collection of clock signal lines, 100 MHZ_TTL, 100 MHZ_PECL1, #100 MHZ_PECL1, 100 MHZ_PECL2, #100 MHZ_PECL2, 100 MHZ_PECL3, and #100 MHZ_PECL3, form a clock bus, CLK_BUS signal line, which is coupled to the memory storage and delay calculation circuit 40 as illustrated in FIG. 2.

Although only one exemplary embodiment of a master clock circuit is shown in FIG. 3, other methods and circuits for producing regular clock pulses may be used. For example, 555 timer circuits, capacitor discharging circuits, and other integrated and discrete-component timing circuits may be used to construct the master clock circuit 32 and produce regular clock pulse.

Figure 4:
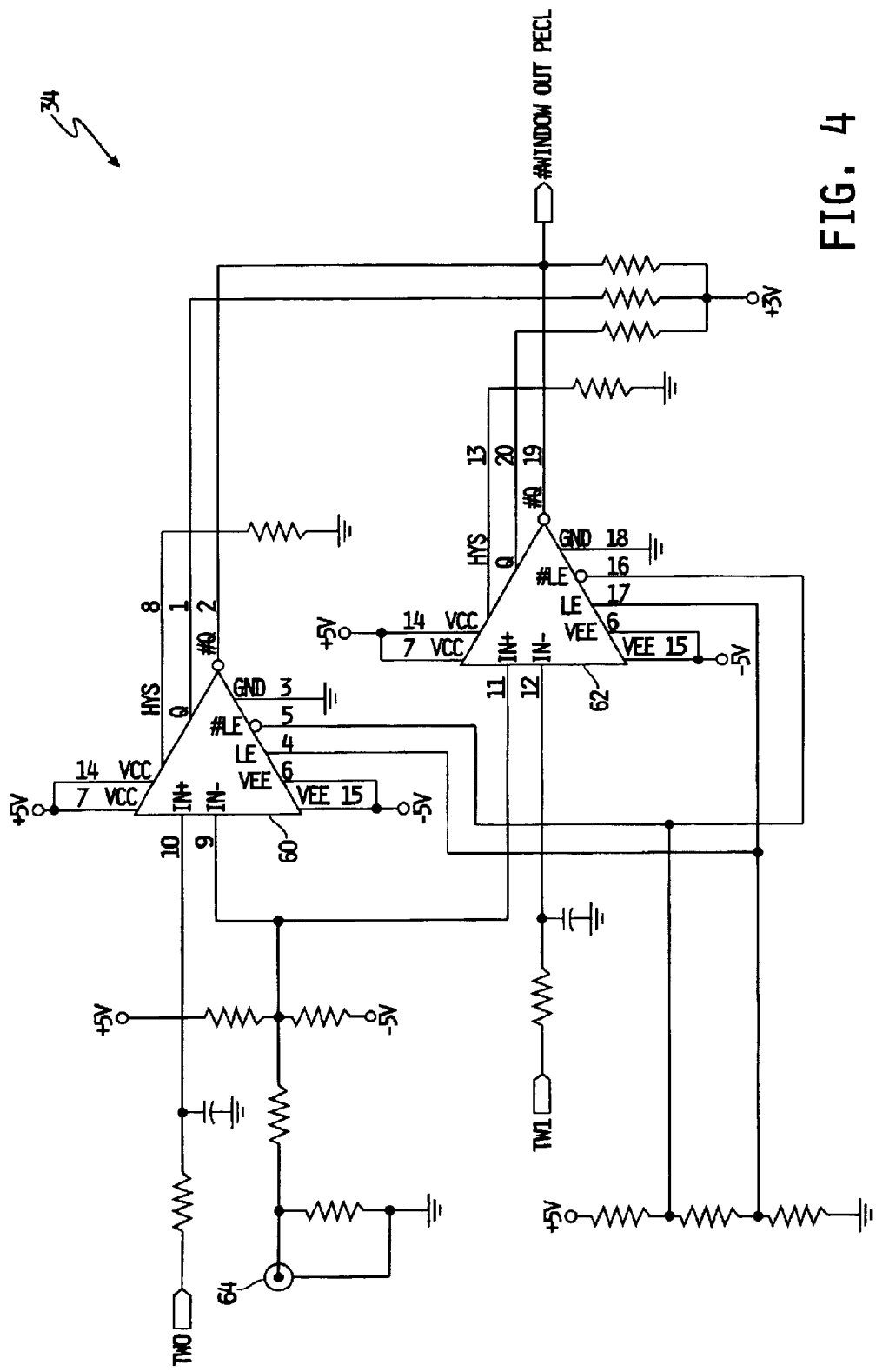
FIG. 4 illustrates an edge detection circuit of the circuit illustrated in FIG. 2.

Referring now to FIG. 4, the trigger detection circuit 34 detects the presence of a trigger event received on an input signal line. In the illustrated embodiment of FIG. 4, the trigger event is detected by a window comparator with two predetermined reference voltages. The window comparator is formed from a predetermined maximum voltage reference and a predetermined minimum voltage reference. In some embodiments, the reference voltages may be buffered using, for example, differential amplifiers. The voltage level of the trigger event must fall within the voltage window created by these predetermined maximum and minimum voltage references for the trigger event to be recognized by the circuit 34. The illustrative trigger detection circuit 34 includes two comparators 60, 62. A maximum voltage reference, TW0, signal line is coupled to the IN+ input terminal of comparator 60. Comparator 60 illustratively is a Maxim type MAX9601 dual PECL ultra-high-speed comparator. The IN− input terminal of comparator 60 is coupled to a port 64 carrying the trigger event or pulse. In this configuration, comparator 60 compares the maximum voltage reference signal, TW0, applied to its IN+ terminal and the voltage level of any trigger event applied to the IN− terminal. If the voltage level of the trigger event falls below the maximum voltage reference, the comparator 60 will produce a PECL low level signal at the #Q output terminal. The minimum voltage reference, TW1, signal line is coupled to the IN− input terminal of comparator 62. Comparator 62 also illustratively is a Maxim type MAX9601 comparator. The IN+ input terminal of the comparator 62 is coupled to the IN− input terminal of comparator 60 and to the port 64 carrying the trigger event. In this configuration, comparator 62 compares the minimum voltage reference signal, TW1, applied to the IN− terminal and the voltage level of any trigger event applied to the IN+ terminal. If the voltage level of the trigger event falls above the minimum voltage reference, the comparator 62 will produce a PECL low level signal at the #Q output terminal. The #Q output terminals of the comparators 60, 62 are coupled together in a wired-OR configuration to a #WINDOW_OUT_PECL signal line. Accordingly, a logic low window trigger signal is produced on the #WINDOW_OUT_PECL signal line when the trigger event voltage is within the voltage window determined by the voltage references. The voltage reference signals, TW0 and TW1, may be produced by the memory storage and delay calculation circuit 20, a separate control circuit, or tied to a constant voltage reference signal. The window can be adjusted as required by the application by adjusting the voltage reference signals, TW0 and TW1.

Figure 5A:
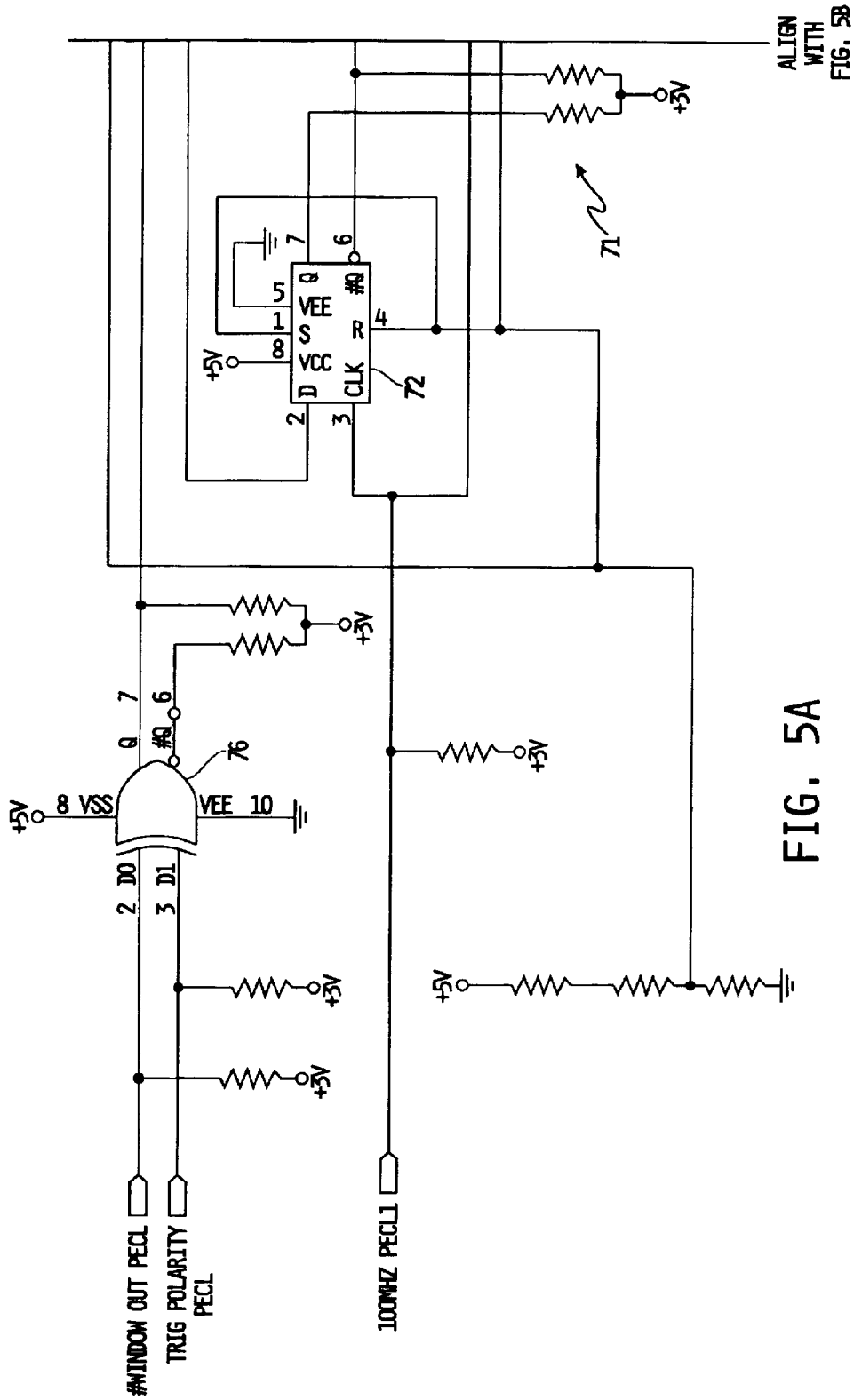
FIG. 5 illustrates a resynchronization and jitter pulse construction circuit of the circuit illustrated in FIG. 2.
Figure 5B:
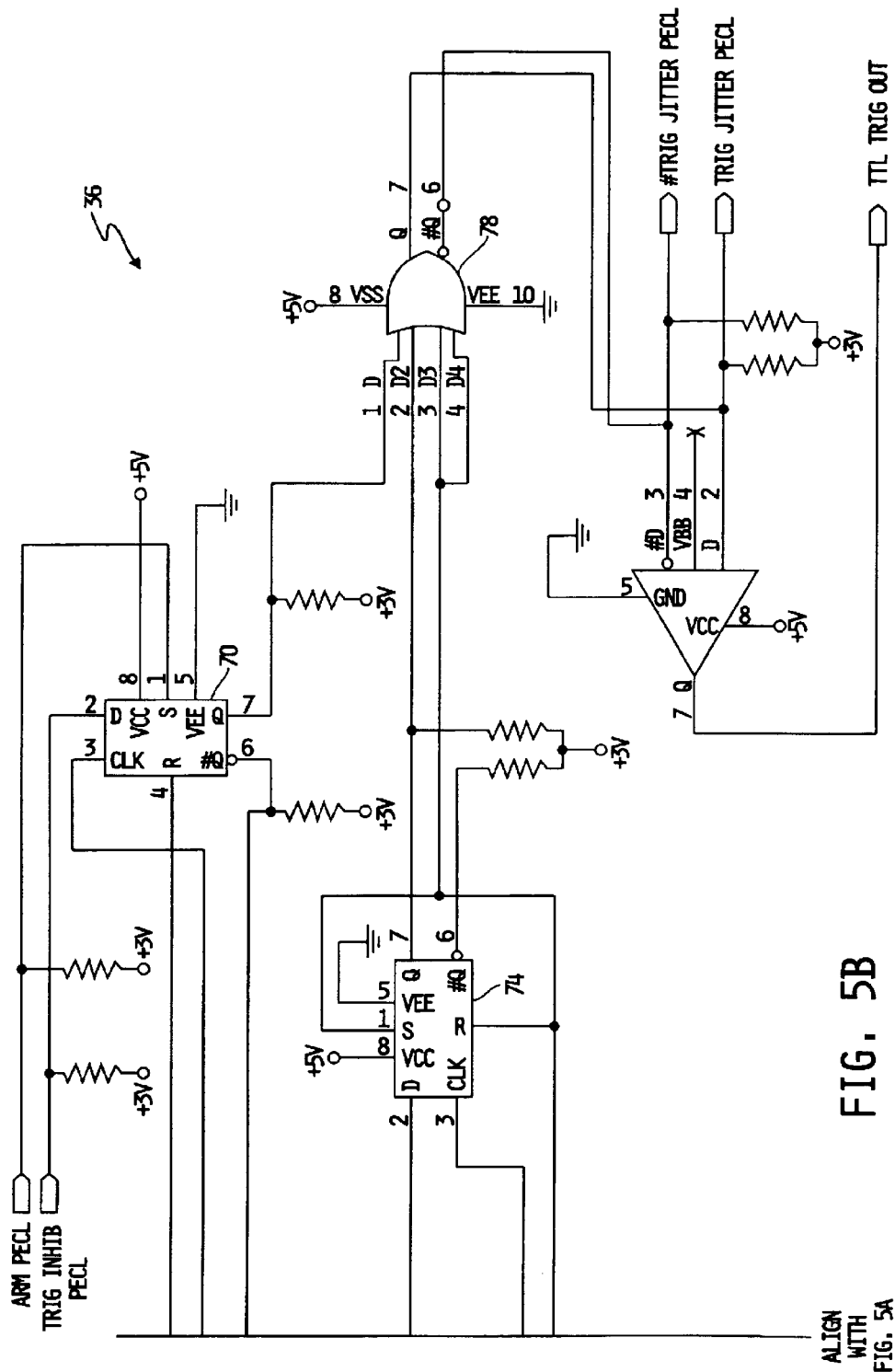

The resynchronization and jitter pulse construction circuit 36 preserves the leading edge of the trigger event signal and synchronizes the trailing edge of the trigger signal with a subsequent clock transition. In the illustrated embodiment, the trigger signal is constructed and synchronized by the cooperation of a plurality of flip-flops. Referring particularly to FIG. 5, the illustrative resynchronization and jitter pulse construction circuit 36 includes a D flip-flop 70. Illustratively, the D flip-flop 70 is an ON Semiconductor type MC100EL31 5V ECL D flip-flop with Set and Reset. Circuit 36 further includes a shift register 71 comprising two D flip-flops 72, 74, also illustratively MC100EL31 flip-flops, and an exclusive-OR (hereinafter sometimes XOR) gate 76, illustratively an ON Semiconductor type MC100EL07 5V ECL 2-input XOR/XNOR gate.

The #WINDOW_OUT_PECL signal line is coupled to a first input terminal of the XOR gate 76. A TRIG_POLARITY_PECL signal line is coupled to a second input terminal of the XOR gate 76. The trigger polarity signal controls the polarity of the window trigger signal and may be used to change the polarity by causing the XOR gate 58 to function as an inverter. This functionality allows subsequent circuit triggering on either the rising or the falling edge of the #WINDOW_OUT_PECL signal, and thereby, the trigger event signal. The TRIG_POLARITY_PECL signal may be a preset logic entity configured during trigger setup or may be produced by a control circuit. Illustratively, as shown in FIG. 2, the TRIG_POLARITY_PECL signal line is coupled to the output synchronization and converter circuit 41. The trigger polarity signal is produced by the memory storage and delay calculation circuit 40 as a TTL signal (i.e., TTL_TRIG_POLAR) and converted from the TTL signal to a PECL signal (i.e., TRIG_POLARITY_PECL) by the circuit 41 as described below in regard to FIG. 9. During normal operation, the TRIG_POLARITY_PECL signal is held at a logic low thereby inverting the #WINDOW_OUT_PECL signal.

The Q output terminal of the XOR gate 76 is coupled to a CLK terminal of the flip-flop 70. The flip-flop 70 may be configured via a number of control signals, ARM_PECL and TRIG_INHIB_PECL. The ARM_PECL signal line is coupled to the set terminal, S, of the flip-flop 70 and the ARM_PECL signal is used to preset the output of the flip-flop 70. The TRIG_INHIB_PECL signal line is coupled to the data terminal, D, of the flip-flop 70 and the TRIG_INHIB_PECL signal is used to configure the logic level of the output of the flip-flop 70 after a triggering event (i.e., a rising edge of the inverted #WINDOW_OUT_

PECL signal). The flip-flop control signals, ARM_PECL and TRIG_INHIB_PECL, may also be preset logic entities configured during setup or may be produced by a control circuit. In the illustrated embodiment, the arm and trigger inhibit control signals are produced by the circuit 40 as TTL signals (i.e., TTL_ARM and TTL_TRIG_INHIB, respectively) and converted from the TTL signal to a PECL signal (i.e., ARM_PECL and TRIG_INHIB_PECL, respectively) by the circuit 41. During normal operation, the flip-flop 70 is preset to a logic high by the ARM_PECL and the TRIG_INHIB_PECL is held to a logic low to provide a logic low output of the flip-flop 70 after the triggering of the flip-flop 70.

The rising edge of the inverted #WINDOW_OUT_PECL signal triggers the flip-flop 70, producing a falling edge on the Q output terminal of flip-flop 70. The Q output terminal of flip-flop 70 is coupled to a first input terminal of an OR gate 78. The OR gate 78 illustratively is an ON Semiconductor type MC100EL01 5V ECL 4-input OR/NOR gate.

The 100 MHZ_PECL1 master clock signal line is coupled to the CLK terminals of the flip-flops 72, 74 of the shift register 71. The D input terminal of the flip-flop 72 is coupled to the #Q output terminal of flip-flop 70. When the flip-flop 70 is triggered, a rising edge or high logic signal is produced on the #Q terminal of the flip-flop 70. This high logic signal is propagated through the shift register 71. The shift register 71 produces a logic high output signal that is substantially coincident with a master clock transition. The Q output terminal of the flip-flop 74 of the shift register 71 is coupled to a second input terminal of OR gate 78. The OR gate 60, therefore, produces a "trigger jitter" output signal which is indicative of the asynchronicity of the initial trigger pulse or event plus one or more clock cycles as determined, in part, by the number of flip flops included in the shift register 71. In the illustrated embodiment of FIG. 5, the output signal of the OR gate 78 is indicative of the asynchronicity of the initial trigger event plus one additional clock cycle. The output signal of the OR gate 78 comprises the asynchronous falling edge output of flip-flop 70 and the synchronous rising edge output of shift register 71. The Q and #Q terminal outputs of OR gate 78 are coupled to the TRIG_JITTER_PECL and #TRIG_JITTER_PECL signal lines, respectively.

Figure 6:
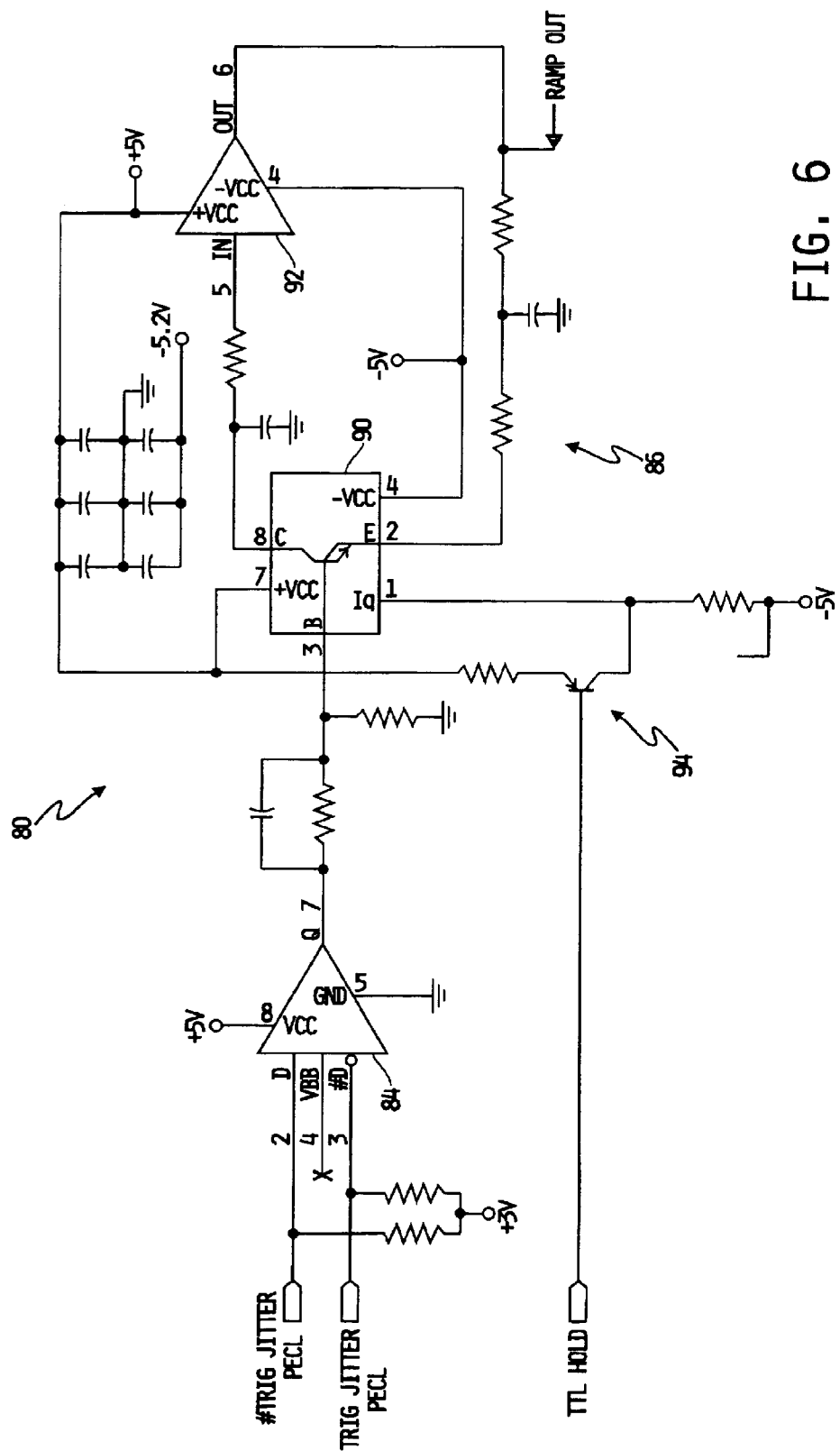
FIGS. 6 and 7 illustrate a time-to-voltage converter and analog-to-digital converter circuit of the circuit illustrated in FIG. 2.
Figure 7:
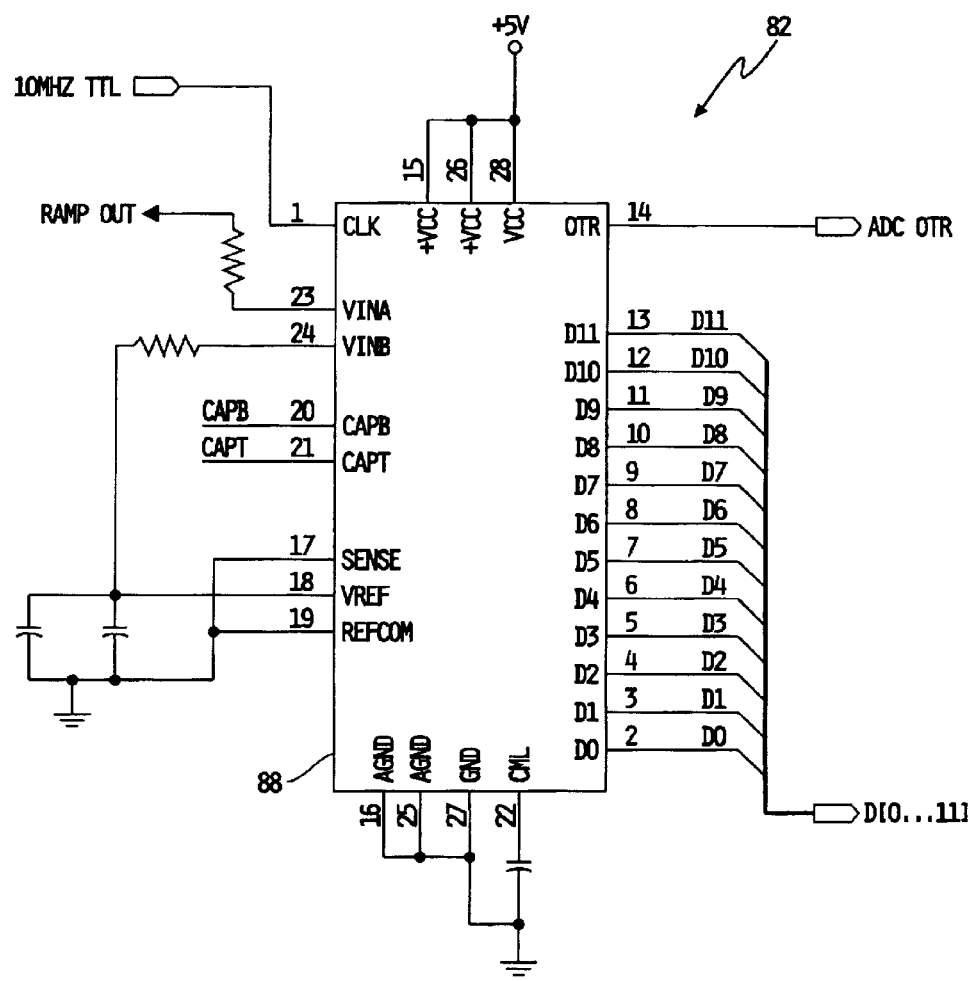

Referring now to FIGS. 6 and 7, the Time-to-Voltage and Analog-to-Digital Converter circuit 38 converts the trigger jitter signal to an analog voltage and the analog voltage to a digital value. The TVC and ADC circuit 38 includes a Time-to-Voltage circuit 80 illustrated in FIG. 6 and an Analog-to-Digital Converter circuit 82 illustrated in FIG. 7. In the illustrated embodiment of FIGS. 6 and 7, the trigger jitter signal is converted to an analog voltage by initiating a ramp generator for the duration of the resynchronized trigger jitter signal. The analog voltage value produced by the ramp generator is held for a time period suitable for an analog-to-digital converter to convert the analog voltage value to a digital value. The digitized voltage is thereby substantially proportional to the trigger jitter signal pulse width which is substantially proportional to the phase difference of the trigger event and a subsequent clock pulse. The illustrative TVC circuit 80 includes a translator 84 and a ramp generator 86. The illustrative ADC circuit 82 includes an analog-to-digital converter 88. Translator 72 illustratively is an ON Semiconductor type MC100ELT21 5V Differential PECL to TTL Translator. The Ramp generator 74 illustratively is a Burr-Brown type OPA660BB wide bandwidth operational transconductance amplifier and buffer. The Analog-to-digital converter 78 illustratively is an Analog Devices type AD9220 A/D converter.

As shown in FIG. 6, the TRIG_JITTER_PECL and #TRIG_JITTER_PECL signal lines are respectively coupled to the D and #D input terminals of the translator 84. The translator 84 converts the PECL trigger jitter signal to a TTL output signal having a width corresponding to the width of the trigger jitter signal. The Q output terminal of the translator 84 is coupled to the Vin (or Base) input terminal of an operational transconductance amplifier 90 of the ramp generator 86, which is configured as an integrator. The Collector terminal of the operational transconductance amplifier 90 is coupled to the INput terminal of a buffer amplifier 92 of the ramp generator 86. A ramp voltage (i.e., the RAMP_OUT signal) is produced at the OUTput terminal of the generator 86. The final ramp voltage is substantially proportional to the trigger jitter signal pulse width.

The final ramp voltage produced by the ramp generator 86 is held for a time period suitable for the ADC circuit 82 to convert the final ramp voltage to a digital value. In the illustrative embodiment of FIGS. 6 and 7, the quiescent current of the operational transconductance amplifier 90 is controlled (i.e., the quiescent current is reduced toward zero) so as to cause the generator 86 to maintain the final ramp voltage for a short period of time (i.e., approximately 500 nanoseconds). Accordingly, a quiescent current adjust terminal, Iq, of the operational transconductance amplifier 90 is used to reduce the quiescent current of the ramp generator 86 to substantially zero amps. To do this, a switch 94, illustratively a Fairchild type MMBTH81 PNP Transistor, is coupled to the Iq terminal of the amplifier 90. The switch 94 is controlled by a TTL_HOLD control signal applied to the base terminal of the switch 94. The quiescent current of the ramp generator 74 may be adjusted (e.g., reduced toward zero) by adjusting the TLL_HOLD signal (i.e., applying a logic low level to the base of the switch 76). The TTL_HOLD signal may be a preset logic entity configured at setup or may be produced by a control circuit. Illustratively, the TTL_HOLD signal is produced by the memory storage and delay calculation circuit 40, as shown in FIG. 2. However, other methods of maintaining the final ramp voltage for a suitable time period may be used. For example, the output of the ramp generator 86 may be coupled to a sample and hold circuit configured to sample the final ramp voltage and hold the voltage value long enough for the ADC circuit 82 to convert the voltage value to a representative digital value.

The RAMP_OUT signal produced by the ramp generator 86, is supplied to the analog-to-digital converter 88 of the ADC circuit 82 on the VINA input terminal as illustrated in FIG. 6. The ADC 82 converts the ramp voltage to a twelve bit digital value. The digital value is a digital representation of the pulse width between the asynchronous trigger event and a subsequent internal clock pulse. The digital value is produced on the output port, terminals D0–D11, of the ADC 88. It should be appreciated that ADCs having lesser or greater resolution (i.e., output bits) may be used so as to increase or decrease the resolution of the digital value according to the requirements of the particular implementation.

Referring back to FIG. 2, the memory storage and delay calculation circuit 40 stores the digital value representing the pulse width between the asynchronous trigger event and a subsequent internal clock pulse in a memory circuit and calculates the appropriate delay time intervals. Storing the representation value digitally in memory improves the drift over time of the representation value compared to an analog storage device, for example, a capacitor storage circuit. The circuit 40 also calculates two distinct time intervals. The first time interval calculated by the circuit 40 is the predetermined, arbitrary initialization delay time of the delayed output event (i.e., the time to delay the beginning of the output trigger pulse). The second time interval calculated by the circuit 40 is the predetermined, arbitrary pulse width of the delayed output event (i.e., the pulse width of the output trigger pulse). The two time intervals are embodied as digital representations of time values which are predetermined during setup. In the illustrated embodiment of FIG. 2, the two time intervals are stored in the circuit 40. However, the two time intervals may be determined, altered, or otherwise supplied to the circuit 30 during runtime conditions and may be stored or produced by other sub-circuits electrically coupled to circuit 40 such as a bank of selectable switches or the like.

Referring now generally to FIGS. 8–12, the two time intervals are used in conjunction with the stored digital value representing the pulse width between the trigger event and a subsequent master clock pulse, or calculated digital values based thereon, to produce a delayed output event having an initialization delay approximately equal to the arbitrary initialization delay time and a pulse width substantially equal to the arbitrary pulse width time. To do so, the arbitrary initialization delay time is summed with the digital value to produce a final initialization delay time. After the lapse of this final initialization delay time, the delayed output event or pulse is initialized. The arbitrary pulse width time is also summed with the digital value to produce a final pulse width time. After the lapse of this final pulse width delay time, the delayed output event or pulse is terminated. In the illustrated embodiment, the arbitrary initialization delay time and the digital value representing the pulse width between the trigger event and a subsequent master clock pulse are summed by converting the stored digital value to an analog value and further to a time value after the lapse of the arbitrary initialization delay. Subsequently, the delayed output event or pulse is initiated. Similarly, the arbitrary pulse width time and the digital value are summed by converting the stored digital value to an analog value and further to a time value after the lapse of the arbitrary pulse width time Subsequently, the delayed output event or pulse is terminated. In other embodiments, the two time intervals may be summed separately with the digital value internally within the circuit 40. The delayed output pulse may then be initialized after the expiration of the final initialization delay time, as counted or otherwise determined by the circuit 40, and terminated after the expiration of the final pulse width time, as counted or otherwise determined by the circuit 40. Regardless of the summation process used, it should be appreciated that the digital values summed with the two time intervals may be the stored digital value representing the pulse width between the trigger event and a subsequent master clock pulse or calculated digital values based on the stored digital value. The two calculated digital values may be the same value or different values for each separate time interval. Such calculated digital values may be used in those embodiments where the arbitrary initialization delay may be a non-multiple of the master clock period (see the discussion of FIG. 11), other extraneous values are accounted for such as calibration factors, and the like.

In the illustrated embodiment, the digital value representing the pulse width between the trigger event and a subsequent master clock pulse is stored in a memory register. The two distinct time intervals are calculated by a programmable processing circuit as discussed below in regard to FIGS. 8 and 11. The stored digital value, or calculated digital values based thereon, is converted to an analog value by a digital-to-analog converter and further converted to a time representation value by a voltage-to-time converter as discussed below in regard to FIGS. 10–12.

Figure 8:
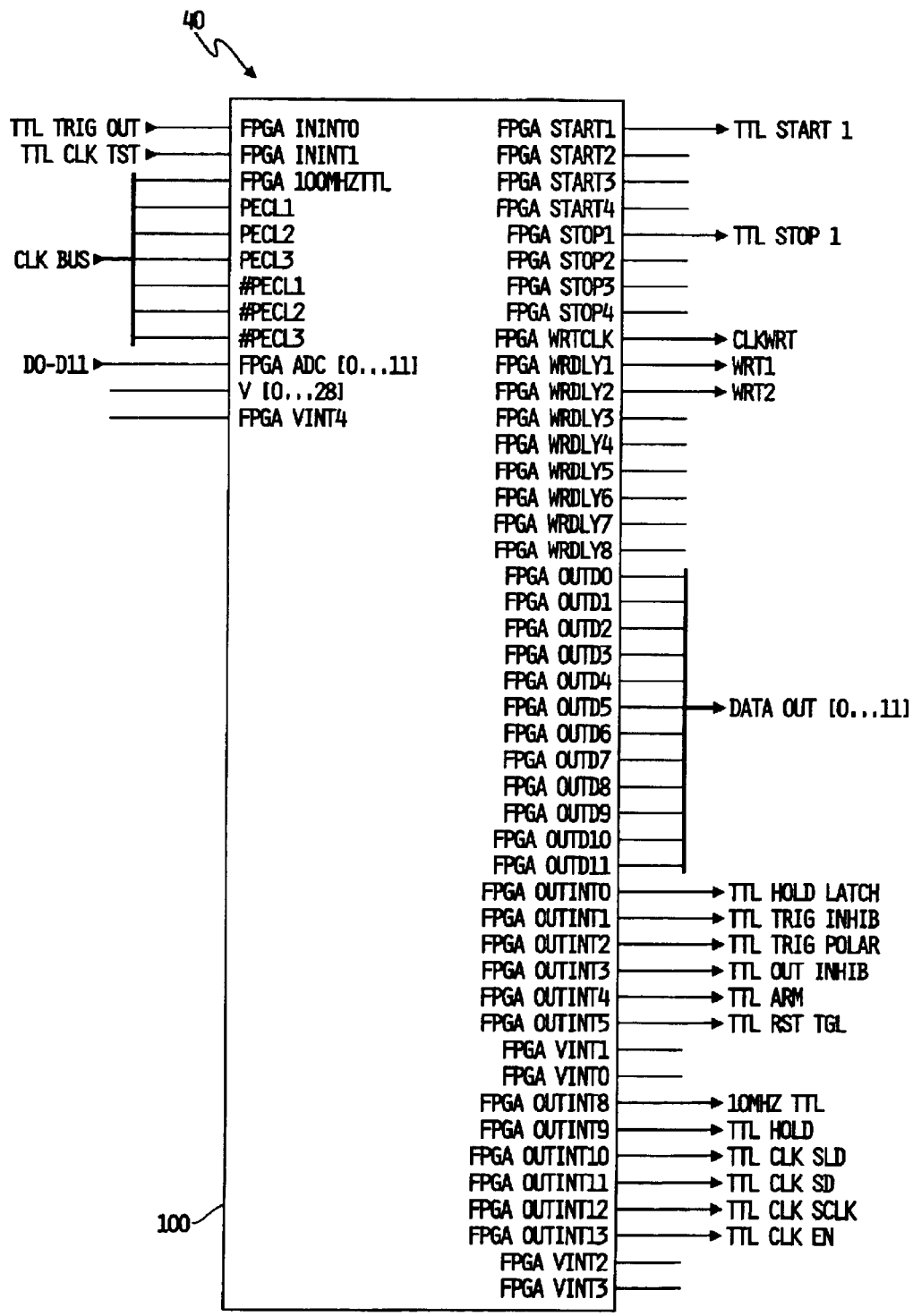
FIG. 8 illustrates a memory storage and delay calculation circuit of the circuit illustrated in FIG. 2.

Referring now particularly to FIG. 8, illustratively, the functions of the memory storage and delay calculation circuit 40 are programmed into a Field-Programmable Gate Array device 100 (hereinafter sometimes FPGA). However, in other embodiments the functions of the circuit 40 may programmed into other types of integrated circuits or be implemented using discrete circuits and/or sub-circuits. The FPGA 100 illustratively is an Altera type APEX 20K FPGA. The functionality of circuit 40 is embodied as a software program stored in the FPGA 100 and written using Very High Speed Integrated Circuit Hardware Description Language (hereinafter sometimes VHDL). The FPGA 100 receives the digital value representing the pulse width between the trigger event and a subsequent master clock pulse on the D0–D11 signal lines. The digital value is stored within memory locations or registers in the FPGA 100. The FPGA 100 produces the stored digital value, or calculated digital values based on the stored digital value, on output data lines DATA_OUT0-DATA_OUT11. The digital value used in summation with the arbitrary initialization delay time and the digital value used in summation with the arbitrary pulse width time are multiplexed on the DATA_OUT data lines using the WRT1 and WRT2 control signals. Accordingly, the FPGA 100 can produce similar or different stored digital values, or calculated digital values based thereon, for summation with each of the arbitrary time intervals. The FPGA 100 determines the two time intervals via retrieving digital representations of the time intervals from memory locations or registers, or in alternative embodiments, may receive the time interval values on input signal lines. After the lapse of the arbitrary initialization delay time, as determined by the FPGA 100 by counting the appropriate master clock cycles, the FPGA 100 produces a trigger signal or pulse on the TTL_START_1 signal line. Similarly, after the lapse of the arbitrary pulse width time, as determined by the FPGA 100 by counting the appropriate master clock cycles, the FPGA produces a trigger signal or pulse on the TTL_STOP_1 signal line. Although the illustrative embodiment illustrates only one output channel, the FPGA 100 can be configured to accommodate multiple output channels having alternative time intervals produced on other TTL_START and TTL_STOP signal lines. The FPGA 100 also produces a number of control signals, as illustrated in FIGS. 2 and 8, for controlling various circuits of circuit 10.

Figure 13:
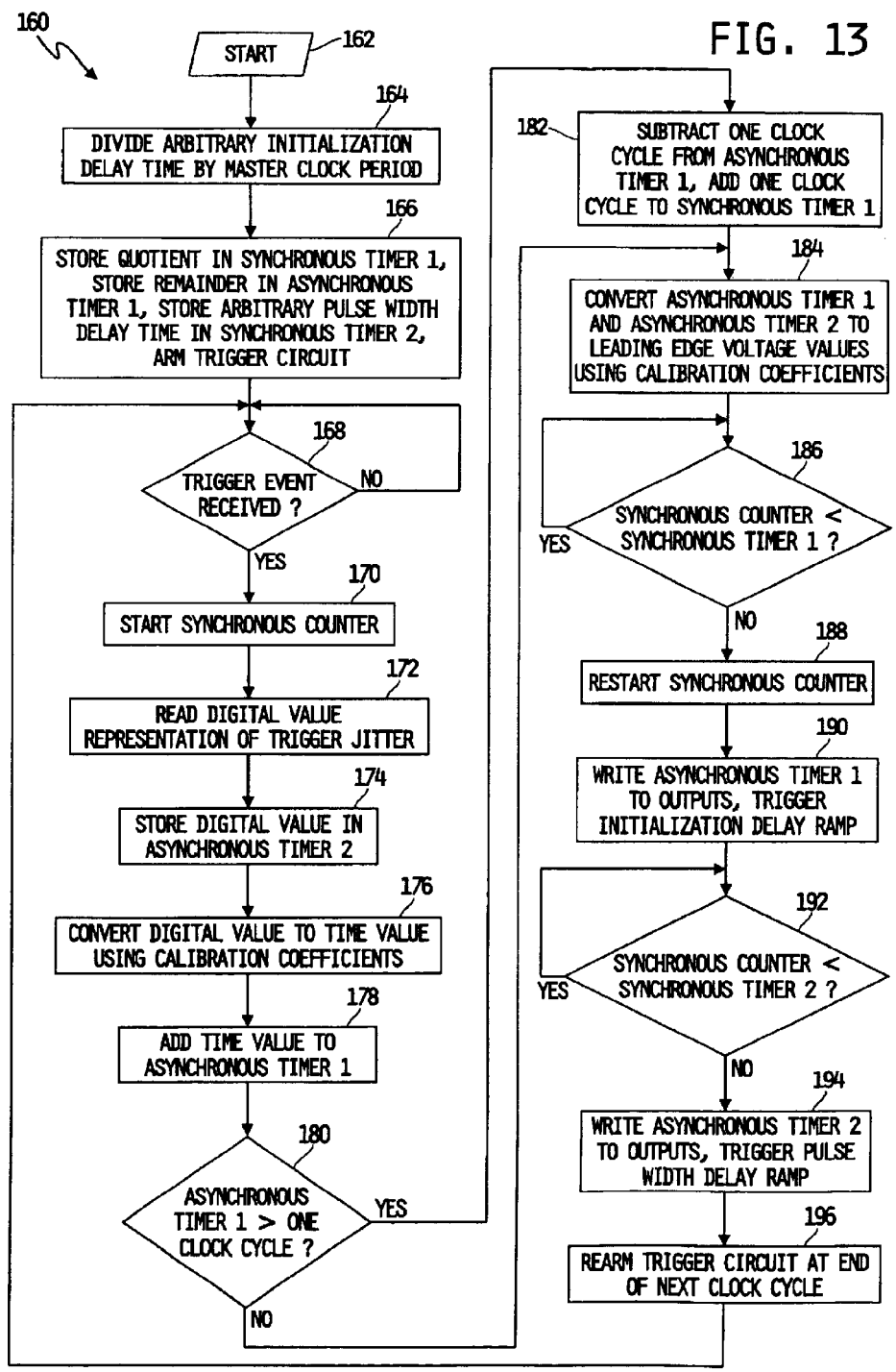
FIG. 13 is a process flow diagram of a memory storage and delay calculation program for use with the circuit illustrated in FIG. 2.
Figure 14:
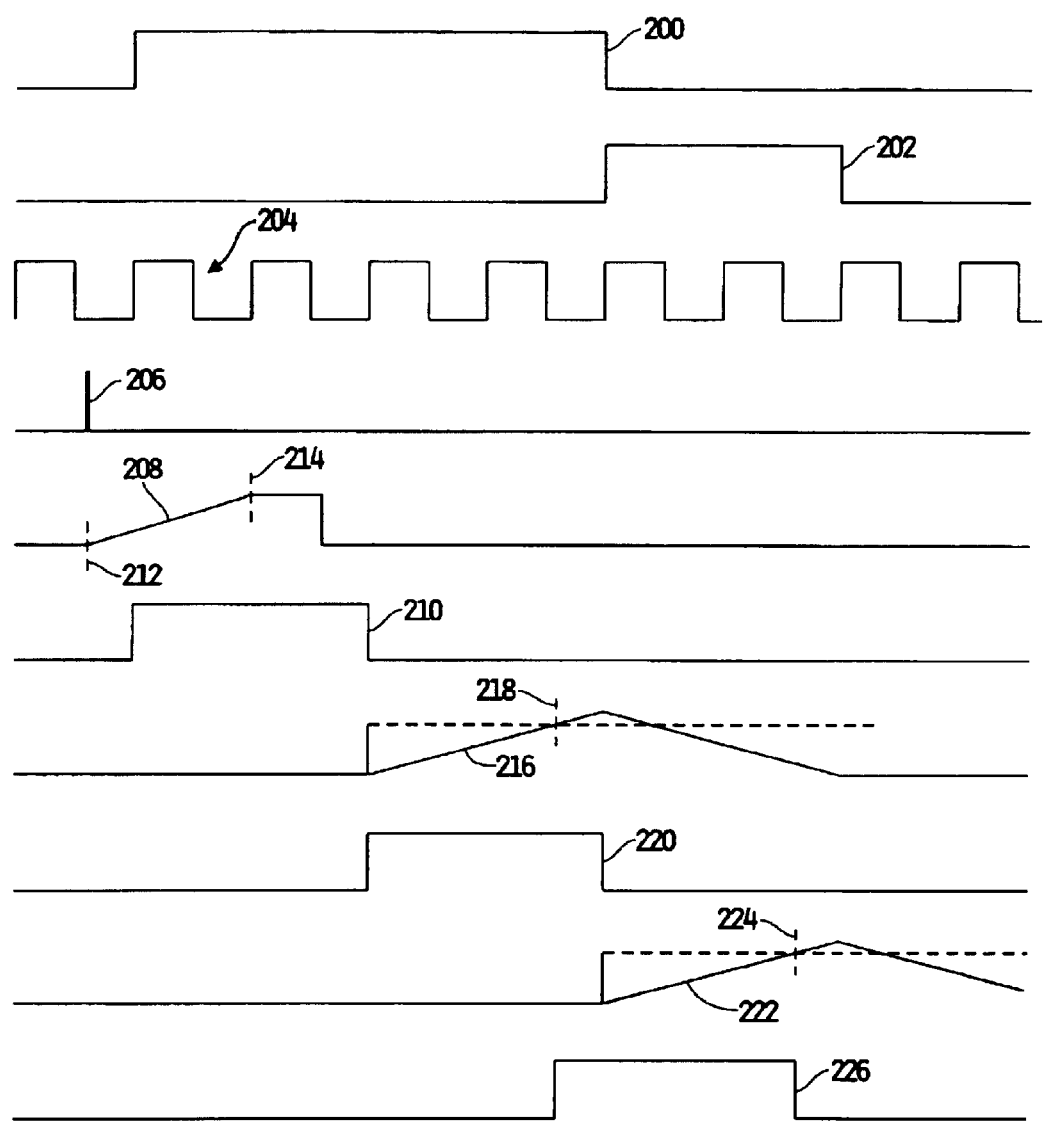
FIG. 14 illustrates a timing diagram of the process illustrated in FIG. 13.

A process flow diagram of a program 160 for use with the FPGA 100 is illustrated in FIG. 13. Illustratively, the program 160 is programmed into the FPGA 100 using VHDL. See the discussion of FIG. 8. The program 160 begins with a process step 162 in which portions of the FPGA 100 are initialized. For example, the desired arbitrary initialization delay time and the arbitrary pulse width time values may be retrieved from memory locations of the FPGA 100, or alternatively, from associated memory devices or input ports of the FPGA 100. The two time values are used to calculate the final initialization delay time and the pulse width of the delayed output event. In process step 164, the arbitrary initialization delay time value is divided by the period of the master clock. The quotient of the operation of process step 164 is loaded into a synchronous timer 1 (e.g., an internal data accumulator, register, memory location, or the like) in process step 166. In the illustrative embodiment, two clock cycles are subtracted from the quotient of the operation of process step 164 to account for the additional clock cycle inherent in the voltage ramp and the leading edge calculation of the trigger event as discussed below in regard to process step 184. Also in process step 166, the remainder of the operation of process step 164 is loaded into an asynchronous timer 1 (e.g., an internal data accumulator, register, memory location, or the like), the arbitrary pulse width delay time value is stored in a synchronous timer 2 (e.g., an internal data accumulator, register, memory location, or the like), and the trigger circuit is armed. An exemplary arbitrary initialization delay time 200 and an exemplary arbitrary pulse width time 202 are illustrated in FIG. 14.

In process step 168, program 160 determines if a trigger event 206 has occurred. The FPGA 100 may determine that a trigger event has occurred by receiving a trigger pulse received on the TTL_TRIG_OUT signal line as illustrated in FIG. 2. If no trigger event 206 has been received, the program 160 continues to monitor for the trigger event 206. Once a trigger event 206 has been received, a synchronous counter is initiated in process step 170. The synchronous counter begins to count master clock cycles beginning with the next clock pulse after the trigger event or pulse as illustratively shown in FIG. 14 as initialization count 210. In addition, a voltage ramp 208 is initiated contemporaneously with the trigger event 206 (see discussion of FIG. 6). For example, as illustrated in FIG. 14, the ramp 208 is initiated at a time point 212. The time point 212 may or may not be synchronous with the trigger event 206 due to inherent delays (e.g., component propagation delays) within circuit 30. The ramp 208 continues to rise until a convenient leading edge of the master clock pulse train 204. Illustratively, the ramp 208 continues for a time period equal to the phase error between the trigger event 206 and the leading edge of the subsequent clock cycle of the master clock pulse train 204 plus one additional clock cycle, i.e., a time point 214 at the rising edge of the second master clock cycle after the detection of the trigger event 206. As is the case with time point 212, the time point 214 may or may not occur synchronously with the rising edge of a clock pulse of the master clock pulse train 204 due to inherent delays within circuit 30. However, the inherent delays within circuit 30 are accounted for during a self-calibration method 230 which will be discussed below in connection with FIGS. 15 and 16. The voltage value of the ramp 208 is held at the final ramp value (i.e., the value at time point 214) for a period of time suitable to convert the analog voltage value to a digital value which thereby represents the pulse width between the trigger event 206 and the second subsequent clock pulse of the master clock pulse train 204 (see discussion of FIG. 6).

In process step 172, the digital value representing the pulse width between the trigger event 206 and the second subsequent master clock pulse is received and read by the FPGA 100 on the D0–D11 data lines. The digital value is subsequently stored in memory in process step 174. Illustratively, the digital value is stored in an asynchronous timer 2 (e.g., an internal data accumulator, register, memory location, or the like). The digital value is converted to a time value in process step 176. The digital value is converted using the calibration coefficients as determined by the self-calibration method 230 discussed below in regard to FIGS. 15 and 16. In process step 178, the converted time value is summed with the time value (i.e., the quotient of process step 164) previously stored in the asynchronous timer 1 (process step 166) and the sum of this addition is stored in the asynchronous timer 1.

In process step 180, the program 160 determines if the time value stored in the asynchronous timer 1 is greater than one master clock cycle. If the time value stored in the asynchronous timer 1 is not greater than one master clock cycle, the program 160 skips process step 182 and advances to process step 184 which will be discussed below. If the time value stored in the asynchronous timer 1 is greater than one master clock cycle, in process step 182, one clock cycle is subtracted from the asynchronous time 1 and one clock cycle is added to the synchronous timer 1. In process step 184, the time values stored in the asynchronous timer 1 and timer 2 are converted to leading edge voltage values using the calibration coefficients as determined by the self-calibration method 230 discussed below in regard to FIGS. 15 and 16. Each of the time values stored in the asynchronous timer 1 and timer 2 are converted to leading edge time values by subtracting their current time values from the period of the master clock. The resultant leading edge time values represent the pulse width from the start of the clock cycle in which the trigger event occurred to the trigger event. In the case of the asynchronous timer 1, the leading edge time value may also include any asynchronous portion of the arbitrary initialization delay time as discussed above in regard to process steps 164 and 166. The leading edge time values are subsequently converted to voltage values using the calibration coefficients.

In process step 186, the program 160 determines if the time value stored in the synchronous timer 1 has elapsed. The FPGA 100 determines the elapse of the synchronous timer 1 by comparing the synchronous counter (i.e., the number of elapsed clock cycles) with the synchronous timer 1. If the synchronous timer 1 has not elapsed, the synchronous counter continues to count clock cycles until the number of counted clock cycles equals the time value stored in the synchronous timer 1. If the synchronous timer 1 has elapsed, the synchronous counter is restarted in process step 188. The synchronous counter begins counting the master clock cycles contemporaneously with the end of the first synchronous counter as illustratively shown in FIG. 14 as pulse width count 220. In process step 190, the voltage value stored in the asynchronous timer 1 is written to the output port of the FPGA 100 and appears on the output signal lines DATA_OUT[0 . . . 11]. As discussed above in regard to FIG. 8, the output data is multiplexed on the DATA_OUT[0 . . . 11] data lines and, consequently, the WRT1 signal is used to identify that the voltage value stored in the asynchronous timer 1 is being written to the DATA_OUT[0 . . . 11] data lines. The initialization delay ramp 216 is also triggered in process step 190 and rises to a target voltage (at time point 218) determined by the voltage value written to the output port, thereby converting the voltage value to a time value. Illustratively, the initialization delay ramp is triggered via the TTL_START_1 signal (see FIG. 11)

The program 160 determines if the time value stored in the synchronous timer 2 has elapsed in process step 192. The FPGA 100 determines the elapse of the synchronous timer 2 by comparing the synchronous counter (i.e., the number of elapsed clock cycles) with the synchronous timer 2. If the synchronous timer 2 has not elapsed, the synchronous counter continues to count clock cycles until the number of counted clock cycles equals the time value stored in the synchronous timer 2. If the synchronous timer 1 has elapsed, the voltage value stored in the asynchronous timer 2 is written to the output port of the FPGA 100 in process step 194 and appears at the output signal lines DATA_OUT[0 . . . 11]. The WRT2 signal is used to identify that the voltage value stored in the asynchronous timer 1 is being written to the DATA_OUT[0 . . . 11] signal lines. The pulse width time ramp 222 is also triggered in process step 194 and rises to a target voltage (at time point 224) determined by the voltage value written to the output port, thereby converting the voltage value to a time value. Illustratively, the initialization delay ramp is triggered via the TTL_STOP_1 signal.

An output pulse 226 is produced which includes an initialization edge corresponding to the time point 218 at which the initialization delay ramp reached the target voltage value as determined by the asynchronous timer 1 and a terminating edge corresponding to the time point 224 at which the pulse width time ramp reached the target voltage value as determined by the asynchronous timer 2. Therefore, the output pulse 226 has an initialization delay substantially equal to the sum of the arbitrary initialization delay and the phase error of the trigger event and a pulse width substantially equal to the arbitrary pulse width time. In process step 196, the trigger circuit is rearmed and the program 160 loops back to process step 168 to monitor for another trigger event.

Figure 9A:
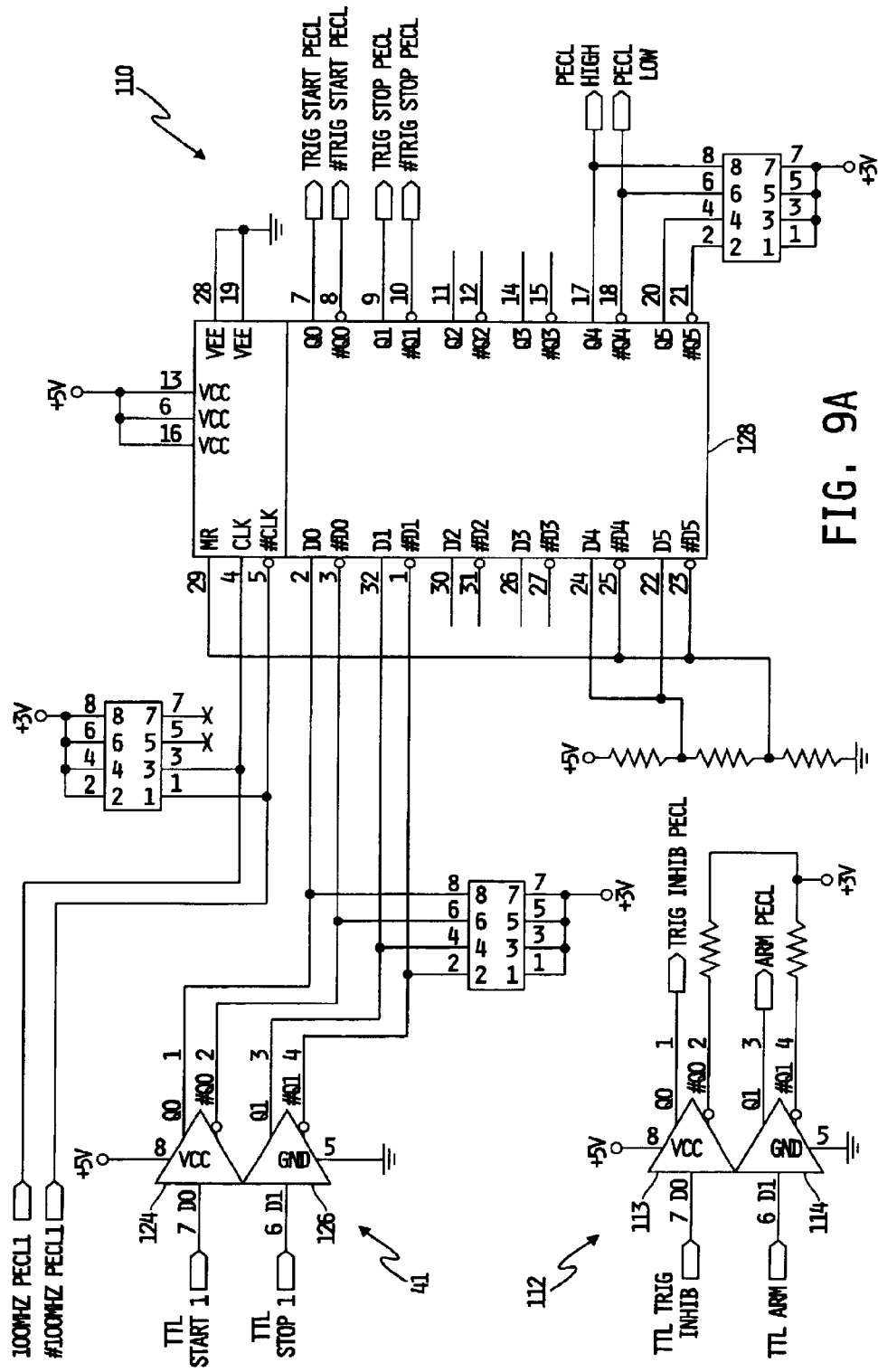
FIG. 9 illustrates an output synchronization and converter circuit of the circuit illustrated in FIG. 2.
Figure 9B:
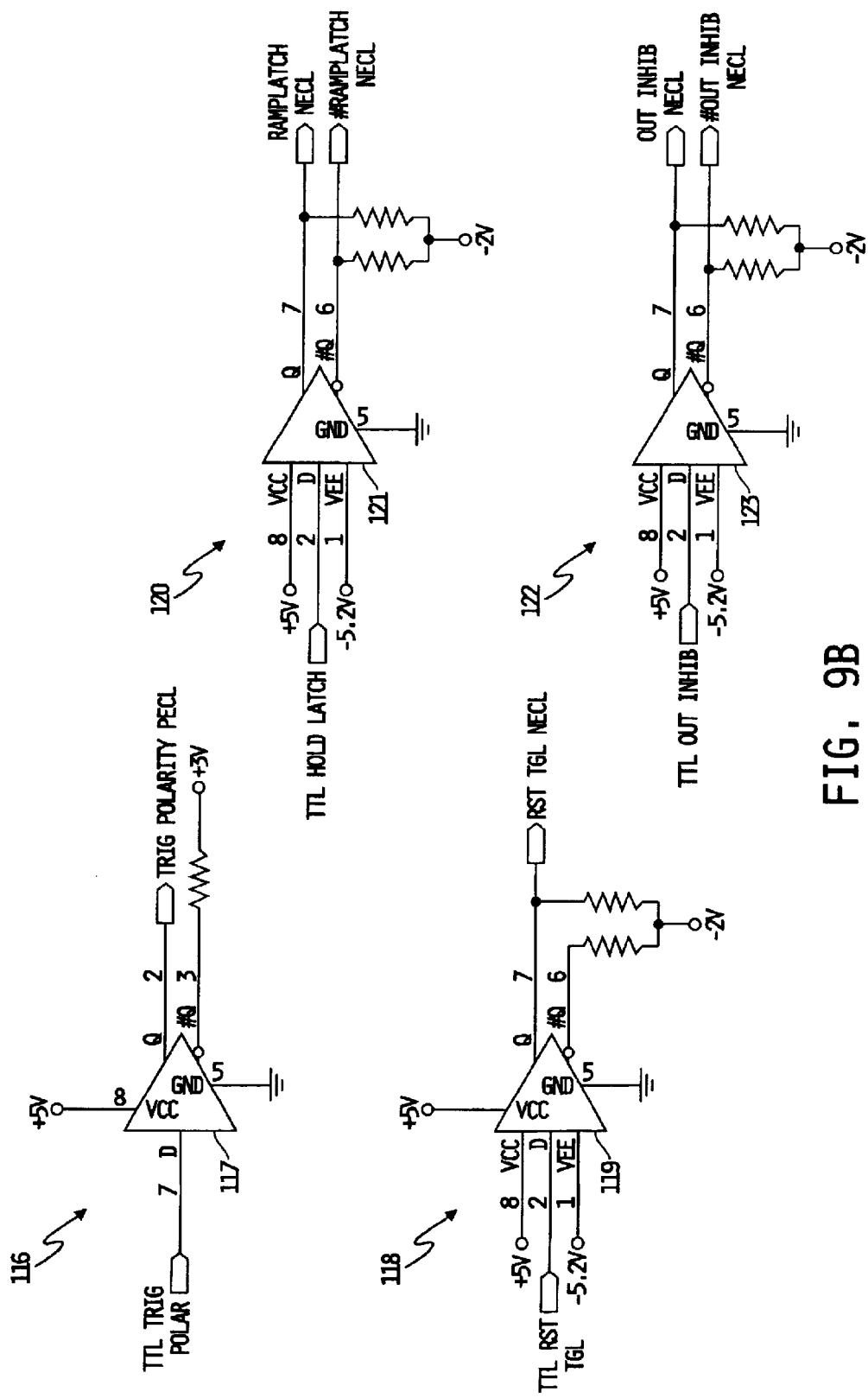

Referring now to FIG. 9, the output synchronization and converter circuit 41 synchronizes a number of the outputs of the memory storage and delay calculation circuit 40 (i.e., the FPGA 100) and converts the outputs of the circuit 41 from TTL outputs to ECL outputs as required by subsequent circuits. The circuit 41 may not be required in those embodiments in which the memory storage and delay calculation circuit 40 exhibits minimal jitter between outputs. Additionally, in embodiments in which the circuit 30 is implemented using a single logic family or in which the logic family of the outputs of circuit 40 match the logic family of the circuits receiving said outputs, the outputs of the circuit 40 need not be converted.

The circuit 41 includes a synchronization circuit 110 and a number of converter circuits 112, 116, 118, 120, and 122. The synchronization circuit 110 includes two translators 124, 126 and a register 128. Illustratively, the translators 124, 126 are two portions of an ON Semiconductor type MC100ELT22 5V dual TTL to differential PECL translator and the register 128 is an ON Semiconductor type MC10EP451 3.3V/5V ECL 6-Bit differential register. The input terminal, D0, of the translator 124 is coupled to the TTL_START_1 signal line and the input terminal, D1, of translator 126 is coupled to the TTL_STOP_1 signal line. The translators 124, 126 convert the TTL_START_1 and TTL_STOP_1 signals produced by the circuit 40 to PECL signals. The outputs, Q and #Q, of translator 124 are coupled to the D0 and #D0 input terminals of the register 128. The outputs, Q and #Q, of translator 126 are coupled to the D1 and #D1 input terminals of the register 128. The clock terminals, CLK and #CLK, of the register 128 are coupled to the 100 MHZ_PECL and #100 MHZ_PECL master clock signal lines. The Q0 and #Q0 output terminals of register 128 are coupled to the TRIG_START_PECL and #TRIG_START_PECL signal lines, respectively, of the register 128. Similarly, the Q1 and #Q1 output terminals of the register 128 are coupled to the TRIG_STOP_PECL and #TRIG_STOP_PECL signal lines, respectively, of the register 128. The register 128 minimizes any jitter present in the outputs of the memory storage and delay calculation circuit 40 by synchronizing the start and stop signals with the master clock.

Each of the converter circuits 112, 116, 118, 120, 122 include TTL to ECL translators to convert the TTL control signals to ECL signals. In particular, the converter circuit 112 includes a translator 113 having an input terminal, D0, coupled to the TTL_TRIG_INHIB signal line and a translator 114 having an input terminal, D1, coupled to the TTL_ARM signal line. The Q0 output terminal of translator 113 is coupled to the TRIG_INHIB_PECL signal line and the Q0 output terminal of translator 114 is coupled to the ARM_PECL signal line. Illustratively, the translators 113, 114 are two portions of an ON Semiconductor type MC100ELT22 5V dual TTL to differential PECL translator. The converter circuit 116 includes a translator 117, illustratively an ON Semiconductor type MC100ELT20 5V TTL to differential PECL translator, having an input terminal, D, coupled to the TTL_TRIG_POLAR signal line and an output terminal, Q, coupled to the TRIG_POLARITY_PECL signal line.

Each of the converter circuits 118, 120, 122 includes a translator 119, 121, 123, respectively, configured to convert a TTL control signal to an NECL signal. Illustratively the translators 119, 121, 123 are ON Semiconductor type MC100ELT24 5V TTL to differential ECL translators. The translator 119 includes an input terminal, D, coupled to the TLL_RST_TGL signal line and an output terminal, Q, coupled to the RST_TGL_NECL signal line. The translator 121 includes an input terminal, D, coupled to the TTL_HOLD_LATCH signal line and output terminals, Q and #Q, coupled to the RAMPLATCH_NECL and #RAMPLATCH_NECL signal lines, respectively. The translator 123 includes an input terminal, D, coupled to the TTL_OUT_INHIB signal line and output terminal, Q and #Q, coupled to the OUT_INHIB_NECL and #OUT_INHIB_NECL signal lines, respectively. Additional converter circuits may be used in other embodiments to convert additional control signals to similar or other logic families as required by the particular embodiment or implementation of the circuit 30.

Figure 10:
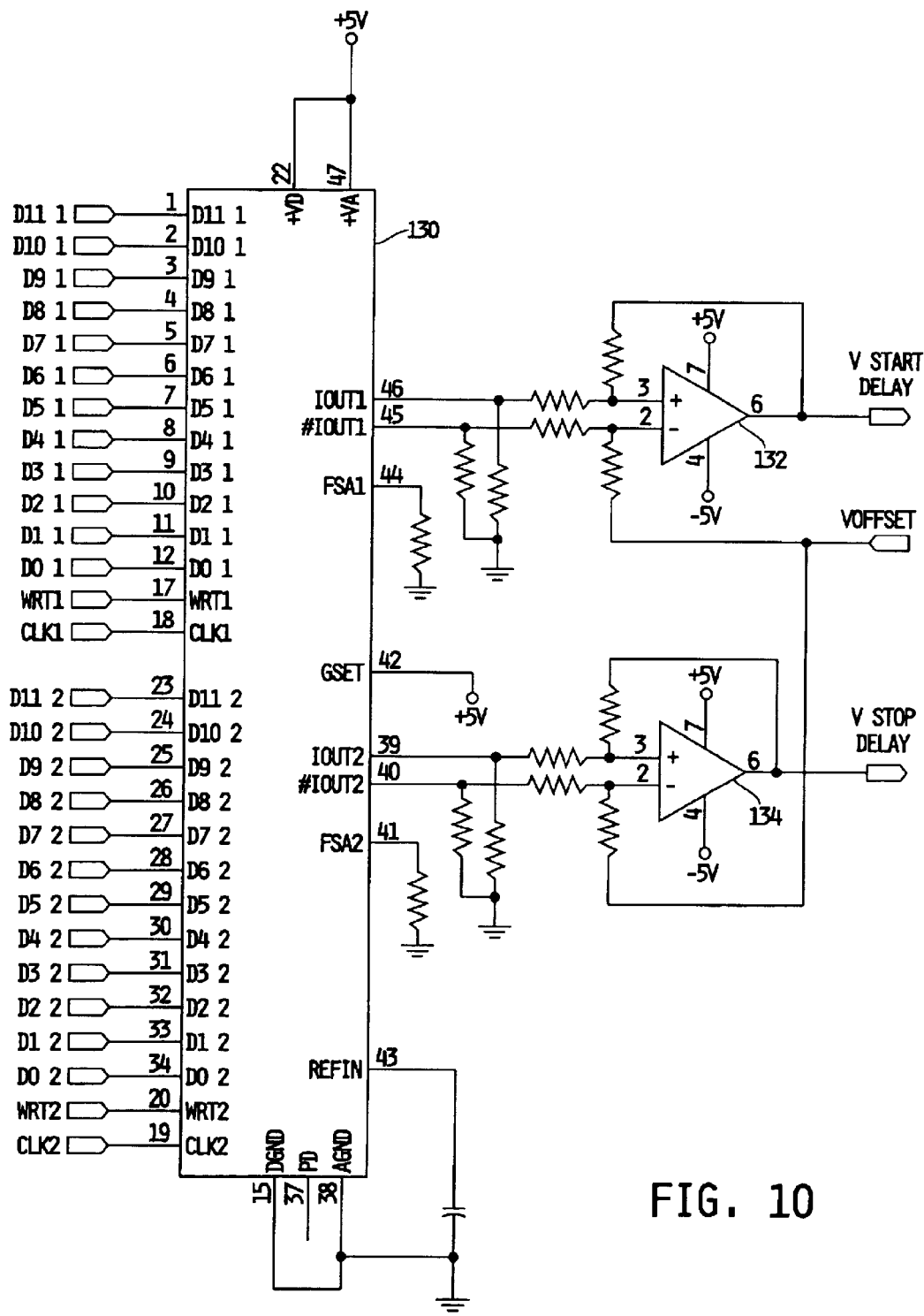
FIGS. 10–12 illustrate a delay output circuit of the circuit illustrated in FIG. 2.
Figure 11A:
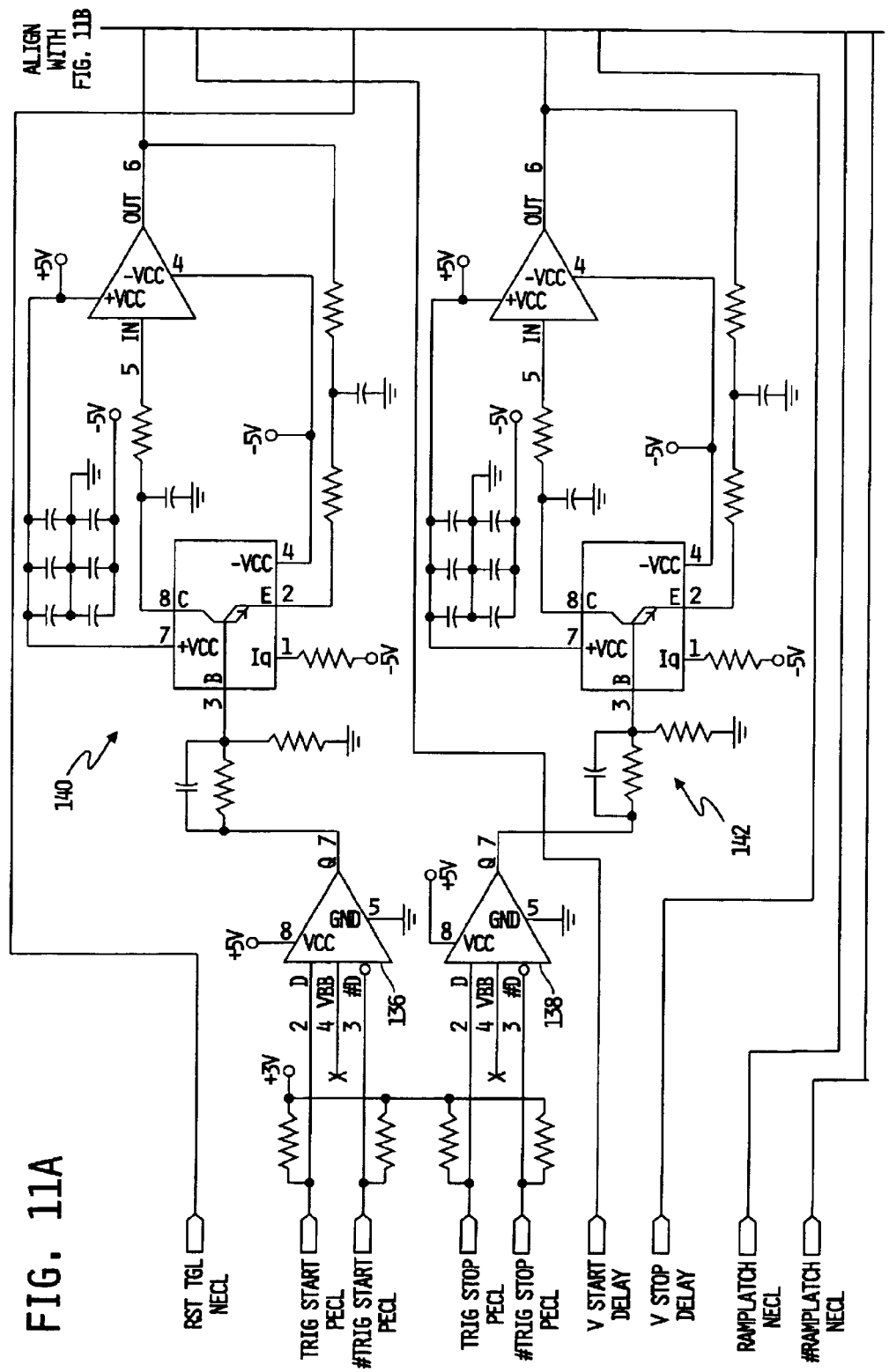
Figure 11B:
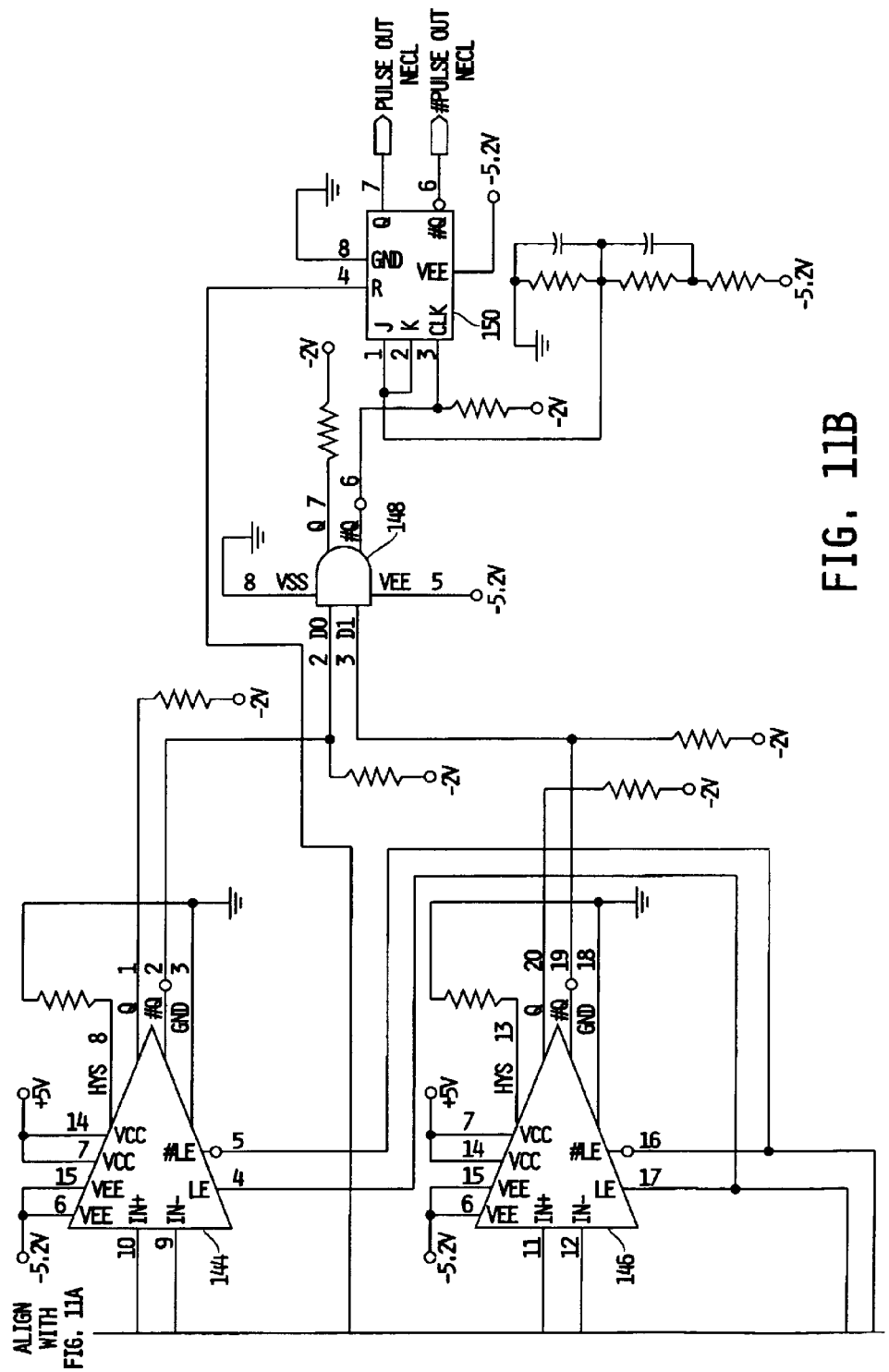
Figure 12:
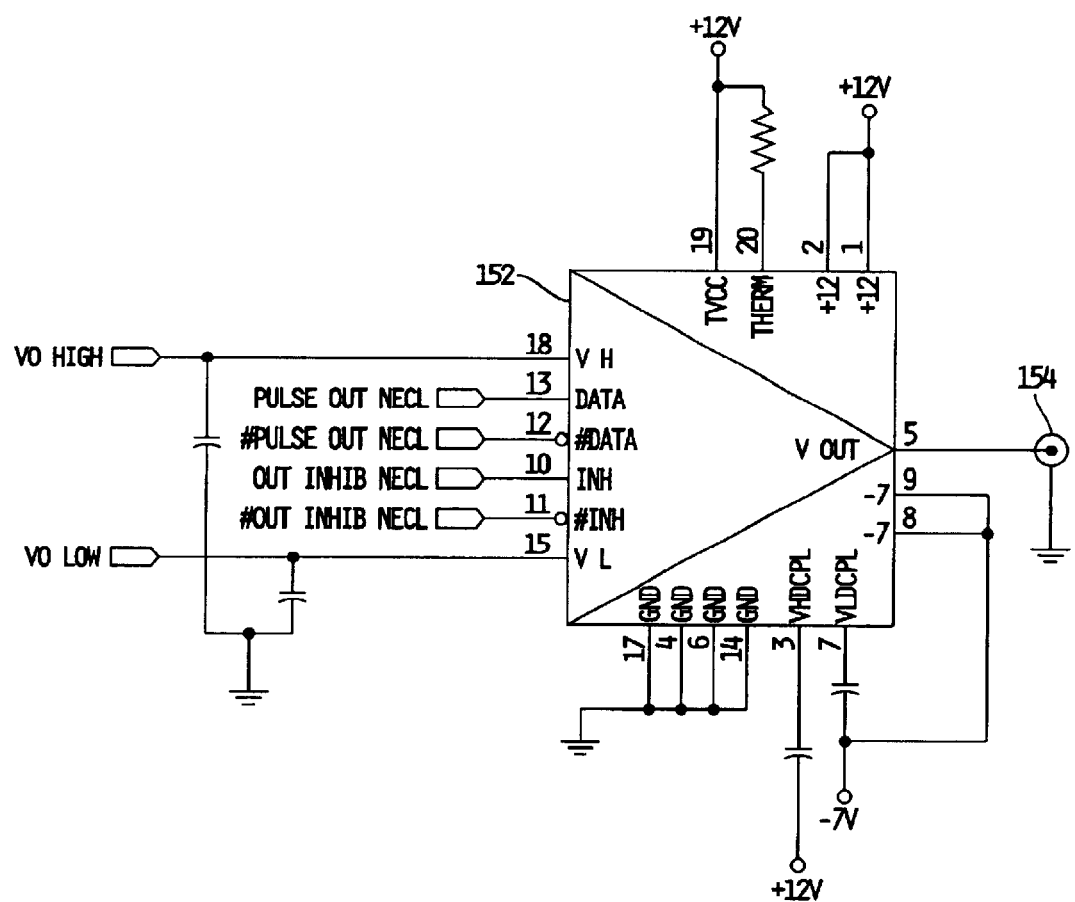

Referring now particularly to FIGS. 10–12, the delay output circuit 42 delays the initialization of the output delay event by the sum of the pulse width between the trigger event and a subsequent master clock pulse as represented by the stored digital value and the arbitrary initialization delay time. Further, the circuit 42 produces an output delay event having a pulse width substantially equal to the arbitrary pulse width delay at an output port. In the illustrated embodiment, a digital-to-analog converter converts the stored digital value, or calculated digital values based thereon, to a first and second analog voltage value. A first voltage ramp is initiated after the arbitrary initialization delay time has elapsed as determined by the circuit 40. Once the first voltage ramp equals the first converted analog voltage value, a first output pulse is generated. A second voltage ramp is initiated after the arbitrary pulse width delay time has elapse as determined by the circuit 40. Once the voltage of the second ramp equals the second converted analog voltage value, a second output pulse is generated. A delayed output event is subsequently produced having an initialization edge (i.e., a rising edge) corresponding to the first output pulse and a terminating edge (i.e., a falling edge) corresponding to the second output pulse.

Illustratively, the delay output circuit includes a digital-to-analog converter 130, a first and second current-to-voltage converter 132, 134, respectively, a first and second translator 136, 138, respectively, a first and second ramp generator 140, 142, respectively, a first and second comparator 144, 146, an AND gate 148, a JK flip-flop 150, and an integrated driver 152. The DAC 130 illustratively is a Burr-Brown type DAC2902 dual, 12 bit, 125MSPS, digital-to-analog converter. The converters 132, 134 illustratively are Burr-Brown type OPA686/SO wideband, low noise, voltage feedback operational amplifiers. The translators 136, 138 illustratively are ON Semiconductor type MC100ELT21 5V differential PECL to TTL translators. The ramp generators 140, 142 illustratively are Burr-Brown type OPA660BB wide bandwidth operational transconductance and buffers. The comparators 144, 146 illustratively are Maxim type MAX9600 dual ECL ultra-high-speed comparators. The AND gate 148 illustratively is an ON Semiconductor type MC100EL04 5V ECL 2-input AND/NAND gate. The JK flip-flop 150 illustratively is an ON Semiconductor type MC100EL35 JK flip-flop and the integrated driver 152 is an Analog Devices type AD53040 ultrahigh speed pin driver.

Referring particularly to FIG. 10, the DAC 130 includes a first and second input port having data input terminals D0_1–D11_1 and D0_2–D11_2, respectively. The D0_1–D11_1 and D0_2–D11_2 data terminals are wired in a parallel configuration to the data lines D0–D11, respectively (See FIG. 2). Data information is multiplexed on the data lines, D0–D11, by the FPGA 100. The WRT1 and WRT2 control signals determine the particular port and associated data terminals of the DAC 130 to which the data on the D0–D11 data lines is written. Accordingly, the WRT terminal of DAC 130 is coupled to the WRT1 signal line and the WRT2 terminal of DAC 130 is coupled to the WRT2 signal line. The DAC 130 converts the digital values received at the first and second input ports to analog output values produced at IOUT1 and IOUT2 terminals, respectively, of the DAC130. The outputs of the DAC 130 are current outputs and are subsequently converted to voltage outputs by the converters 132, 134. The IOUT1 and #IOUT1 terminals of the DAC 130 are coupled to the non-inverting input terminal (+) and inverting input terminal (−), respectively, of the converter 132. Similarly, the IOUT2 and #IOUT2 terminals of the DAC 130 are coupled to the non-inverting input terminal (+) and the inverting input terminal (−), respectively, of the converter 134. The output of converters 132, 134 are analog voltage values of the digital values received on the data lines D0–D11. In particular, the output of the converter 132 corresponds to the asynchronous timer 1 voltage value which provides a target voltage level for the output initialization delay ramp and is coupled to the V_START_DELAY signal line. The output of the converter 132 corresponds to the asynchronous timer 2 voltage value which provides a target voltage level for the output pulse width ramp and is coupled to the V_STOP_DELAY signal line. The operation of the voltage ramps is discussed in detail below in regard to FIG. 11.

Referring now particularly to FIG. 11, the V_START_DELAY and V_STOP_DELAY signal lines are coupled to the IN− terminals of comparators 144, 146, respectively. The TRIG_START_PECL and #TRIG_START_PECL signal lines are coupled to the Q and #Q inputs of the translator 136. The TRIG_STOP_PECL and #TRIG_STOP_PECL signal lines are coupled to the Q and #Q inputs of translator 138. The translators 136, 138 convert the PECL signals on the TRIG_START_PECL and TRIG_STOP_PECL signal lines to TTL signals. The output of the translator 136 is coupled to the Vi input terminal of the operational transconductance amplifier of the ramp generator 140. The ramp generator 140 is configured as an integrator and generates a voltage ramp when the generator 140 receives the TRIG_START_PECL signal. The OUTput terminal of ramp generator 140 is coupled to the IN+ terminal of the comparator 144. The comparator 144 produces a PECL low logic level pulse signal on the #Q output terminal when the ramp voltage of the ramp generator 140 is substantially equal to or greater than the analog voltage value of the V_START_DELAY data signal. The output value of the comparator 144 is latched for an appropriate time period to produce an output pulse having a suitable pulse width using the RAMPLATCH_NECL and #RAMPLATCH_NECL signals. The #Q output terminal of the comparator 144 is coupled to the D0 input terminal of the AND gate 148.

The output of translator 138 is coupled to the Vi input terminal of the operational transconductance amplifier of the ramp generator 142. The ramp generator 142 is also configured as an integrator and generates a voltage ramp when the generator 142 receives the TRIG_STOP_PECL signal. The OUTput terminal of ramp generator 142 is coupled to the IN+ terminal of the comparator 146. The comparator 146 produces a PECL low logic level pulse signal on the #Q output terminal when the ramp voltage of the ramp generator 142 is substantially equal to or greater than the analog voltage value of the V_STOP_DELAY data signal. Similar to the comparator 144, the output value of the comparator 146 is latched for an appropriate time period to produce an output pulse having a suitable pulse width using the RAMPLATCH_NECL and #RAMPLATCH_NECL signals. The #Q output terminal of the comparator 146 is coupled to the D1 input terminal of the AND gate 148.

The AND gate 148 produces a first PECL high logic level pulse corresponding to the PECL low logic level pulse of the output of comparator 144 and a second PECL high logic level pulse corresponding to the PECL low logic level pulse of the output of comparator 146 at its #Q output terminal. The #Q output terminal of the AND gate 148 is coupled to the CLK control terminal of the flip-flop 150. The flip-flop 150 is wired in a toggle configuration with a data value set to an NECL high logic level. The reset terminal, R, of the flip-flop 150 is coupled to the RST_TGL_NECL signal line thereby allowing the flip-flop 150 to be reset according to the RST_TGL_NECL signal. The output terminals, Q and #Q, of the flip-flop 150 are coupled to the PULSE_OUT_NECL and #PULSE_OUT_NECL signal lines. The flip-flop is toggled for a first time at the rising edge of the first PECL high logic level pulse received from the AND gate 148 and toggled a second time at the rising edge of the second PECL high logic level pulse received form the AND gate 148. Accordingly, the PULSE_OUT_NECL signal is an NECL high logic level pulse with a pulse width approximately equal to the width between the rising edges of the first and second PECL high logic level output pulses of the AND gate 148. It should be noted that the output signal of the flip-flop 150 may or may not be synchronous with the master clock.

Referring now to FIG. 12, the PUSLE_OUT_NECL and #PULSE_OUT_NECL signal lines are coupled to the DATA and #DATA terminals, respectively, of the integrated driver 152. The integrated driver 152 translates the voltage level of the output delayed event signal from flip-flop 150 to a voltage level determined by the VO_HIGH and VO_LOW control signals. The integrated driver 152, therefore, permits the production of an output delayed event signal having a variety of logic voltage levels. The control signals, VO_HIGH and VO_LOW, may be preset voltage values or supplied by other circuits. The OUT_INHIB_NECL control signal may be used to control the operation of the integrated driver 152. Accordingly, the OUT_INHIB_NECL and #OUT_INHIB_NECL control lines are coupled to the INH and #INH control terminals of the driver 152, respectively. The V_OUT output terminal of integrated driver 152 is coupled to an output port 154.

Figure 15:
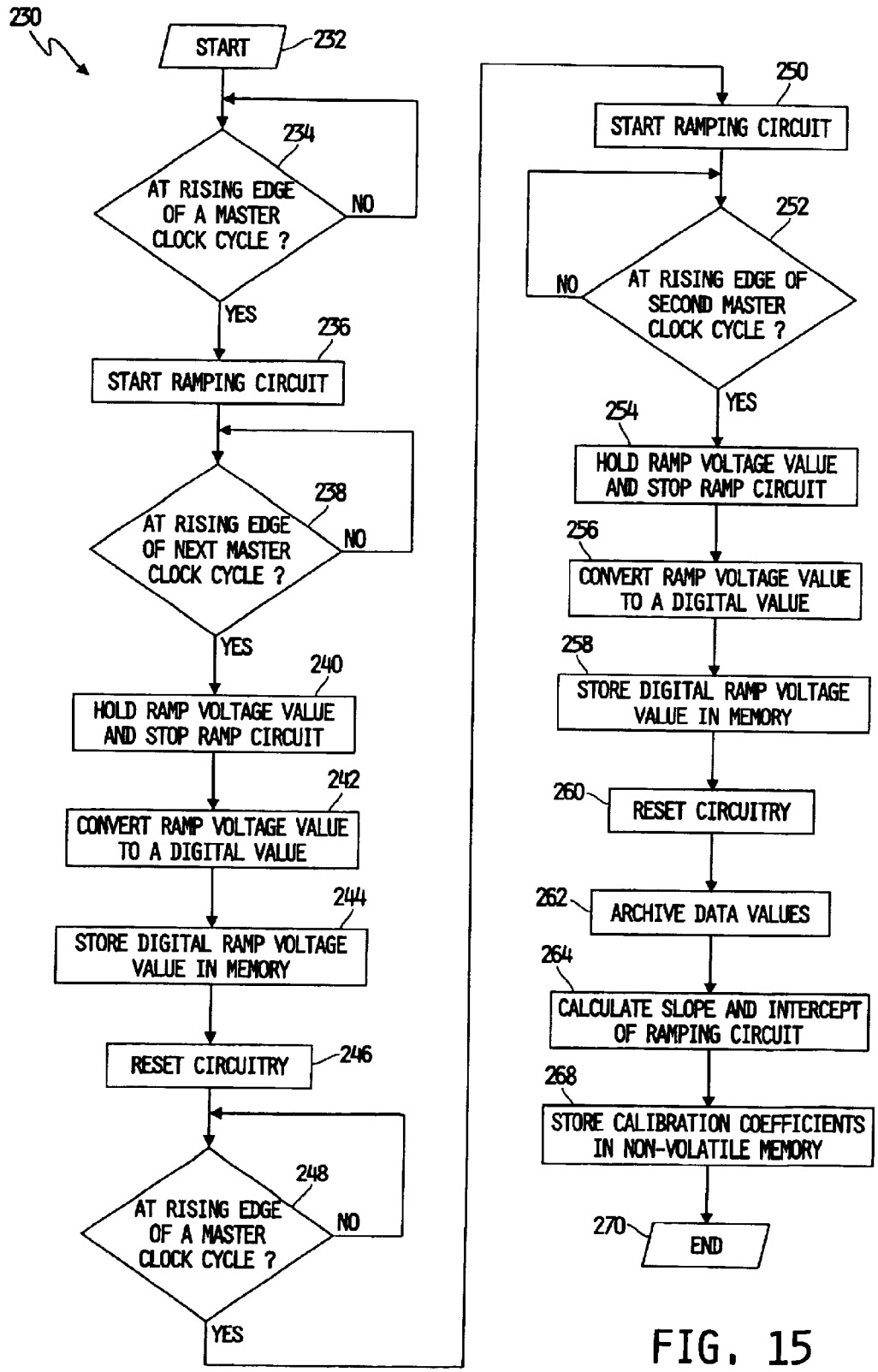
FIG. 15 illustrates a process flow diagram of a self-calibration method for use with the circuit illustrated in FIG. 2.
Figure 16:
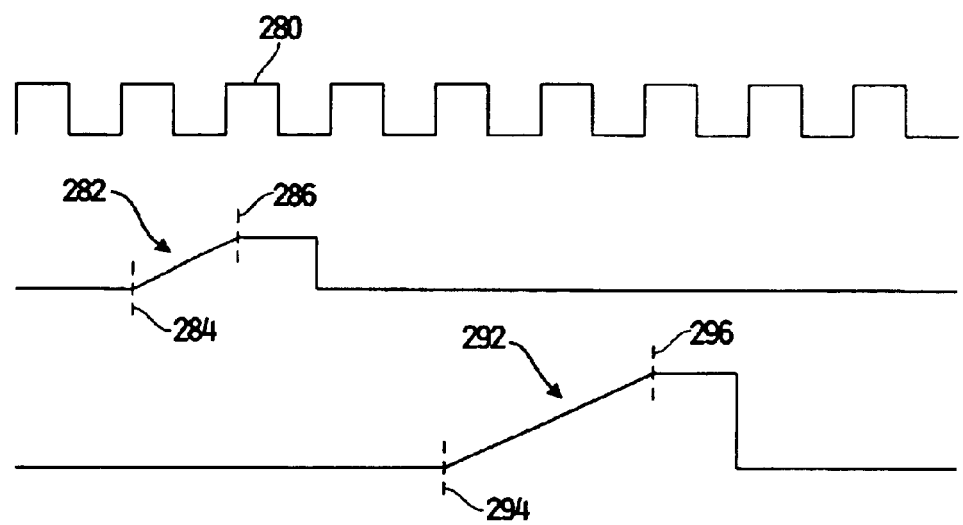
FIG. 16 illustrates a timing diagram of the process illustrated in FIG. 15.

Referring now to FIGS. 15 and 16, the timing accuracy of circuits 10, 30 is affected by the characteristics of the voltage ramp generated by the Time-to-Voltage Converter and Analog-to-Digital Converter circuits 18, 38, respectively. The ramps generated by the internal circuitry of the circuits 10, 30 may include timing uncertainties. For example, the start of the voltage ramps may include unknown internal delays, and therefore, may be asynchronous with the master clock. Similarly, the termination of the voltage ramps may be asynchronous with the master clock. Additionally, sub-circuits and individual components of circuits 10, 30, for example, the ADC 88 of circuit 38 (illustrated in FIG. 7), may include unknown internal or propagation delays. Accordingly, a self-calibration method 230, illustrated in FIGS. 15 and 16, may be used to compensate for the unknown timing uncertainties of the circuits 10, 30. The self-calibration method 230 is discussed below in reference to the circuit 30 which is one illustrative embodiment of the circuit 10 with the understanding that the method 230 may be used with any embodiment of the circuit 10.

The self-calibration method or process 230 begins with a process step 232 in which portions of the circuit 30 are initialized. The initialized portions may include, for example, the master clock circuit 32 among other sub-circuits of circuit 30. In process step 234, the process 230 monitors for a leading edge of a clock cycle of a master clock pulse train. If no leading edge is detected, the process 230 loops back to process step 234 to continue monitoring for a leading edge of a master clock cycle. An exemplary master clock pulse train 280 is illustrated in FIG. 16. In the illustrative embodiment, a leading edge of a master clock cycle corresponds to a rising edge of the master clock cycle, but in other embodiments falling edges of master clock cycles may be used as leading edges of clock cycles.

Once process 230 detects a leading edge (i.e., a rising edge) of a clock cycle of the master clock pulse train 280, a first ramp 282 is initiated in process step 236 at a time point 284 contemporaneously with the detected leading edge of the master clock pulse train 280 as illustrated in FIG. 16. In the illustrative embodiment, the first ramp 282 is produced by the ramp generator 86 of the TVC and ADC circuit 38 of the circuit 30, but other ramp generation circuits may be used to calculate additional inherent delays. It should be appreciated from FIG. 16 that the time point 284 may or may not be synchronous with the leading edge of the clock cycle of the master clock pulse train 280 due to the internal delays of the circuit 30.

The first ramp 282 continues for one full clock cycle of the master clock pulse train 280. The process 230 monitors for the next leading edge of the master clock pulse train 280 in process step 238. If no leading edge is detected, the process 230 loops back to process step 238 to continue monitoring for the leading edge of the next master clock cycle. Once the next master clock cycle has been detected, the first voltage ramp 282 is stopped at a time point 286 contemporaneously with the detected leading edge (i.e., the end of the previous master clock cycle) of the next master clock cycle in process step 240. Also in process step 240, the ramp voltage of the first ramp 282 is held for a suitable time period (e.g., a time period suitable to convert the analog voltage value to a digital value). In the illustrative circuit 30, the ramp voltage produced by the ramp generator 88 of the TVC and ADC circuit 38 is held by controlling the quiescent current of the ramp generator 88, but other methods of holding the ramp voltage may be used such as a sample and hold circuit as discussed above in regard to FIG. 6. Similar to time point 284, it should be appreciated that the time point 286 may be synchronous or asynchronous with the leading edge of the next master clock cycle due to the internal delays of the circuit 30.

The analog voltage value of the first ramp 282 which is held in step 240 is converted to a digital value in process step 242. In the illustrative circuit 30, the analog ramp voltage value is converted to a digital ramp voltage value by the ADC 88 (see FIG. 7) of the TVC and ADC circuit 38. In process step 244, the digital ramp voltage value is stored in a memory location. Illustratively, the digital ramp voltage value is stored by the Memory Storage and Delay Calculation circuit 40 in an internal memory location. Alternatively, the digital ramp voltage value may be stored in an external memory device.

The circuit 30 is reset in process step 246. In process step 248, the process 230 monitors for another leading edge of a clock cycle of the master clock pulse train 280. If no leading edge is detected, the process 230 loops back to the process step 248 to continue monitoring for another leading edge of a master clock cycle. Once process 230 detects another leading edge (i.e., a rising edge) of a clock cycle of the master clock pulse train 280, a second ramp 292 is initiated in process step 250 at a time point 294 contemporaneously with the detected leading edge of the master clock pulse train 280 as illustrated in FIG. 16. Similar to the time point 284, the time point 294 may be synchronous or asynchronous with the leading edge of the clock cycle of the master clock pulse train 280 due to the internal delays of the circuit 30. Additionally, in circuits 30 including more than one TVC and ADC circuit 18, the circuits 18 may be used to initiate multiple ramps at a single time point. In such an embodiment, the initiation time points 284, 294 may or may not be synchronous with each. In those embodiments including a single circuit 18, however, the second ramp 292 is initiated after the termination of the first ramp 282 and, accordingly, the initiation time points 284, 294 are not synchronous with each other.

The second ramp 292 continues for two full clock cycles of the master clock pulse train 280. The process 230 monitors for the second leading edge of the master clock pulse train 280 in process step 252. If the second leading edge is not detected, the process 230 loops back to process step 252 to continue monitoring for the second leading edge of the master clock pulse train 280. Once the second leading edge of the master clock pulse train 280 has been detected, the second voltage ramp 292 is stopped at a time point 296 contemporaneously with the detected second leading edge (i.e., the end of the previous two master clock cycles) of the master clock pulse train 280 in process step 254. Also in process step 254, the ramp voltage of the second ramp 282 is held for a suitable time period (e.g., a time period suitable to convert the analog voltage value to a digital value). The time point 296 may be synchronous or asynchronous with the second leading edge of the master clock pulse train 280 due to the internal delays of the circuit 30.

The analog voltage value of the second ramp 282 which is held in step 254 is converted to a digital value in process step 256. In process step 258, the digital ramp voltage value is stored in a memory location such as in the Memory Storage and Delay Calculation circuit 40. The circuit 30 is subsequently reset in process step 260.

As a result of this self-calibration method 230, voltages at times 284, 286, 294, and 296 are known. These four voltages and their respective times are stored in memory, for example in the Memory Storage and Delay Calculation circuit 40, in process step 262. The process 230 calculates the slope and intercept of a voltage-to-time plot using the archived data values in process step 264. The voltage-to-time plot permits referencing voltage values to time values and time values to voltage values. The voltage-to-time plot may increase the circuit's accuracy because the data points reflect some of the inherent delay times of circuit 30. The coefficients of the voltage-to-time plot are subsequently stored in a memory location in process step 268 and the process 230 ends in process step 270.

Figure 18:
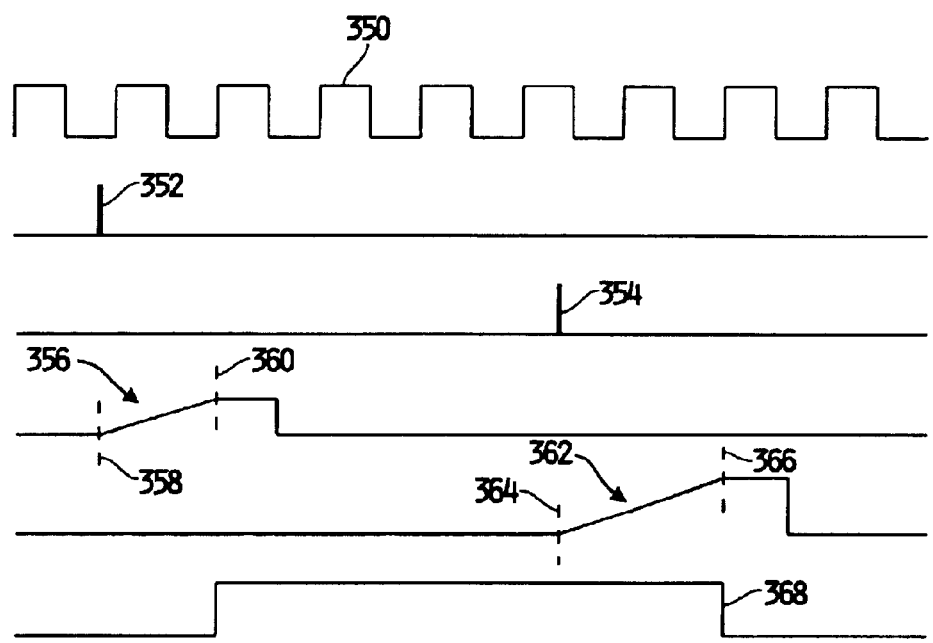
FIG. 18 illustrates a timing diagram of the process illustrated in FIG. 17.
Figure 17:
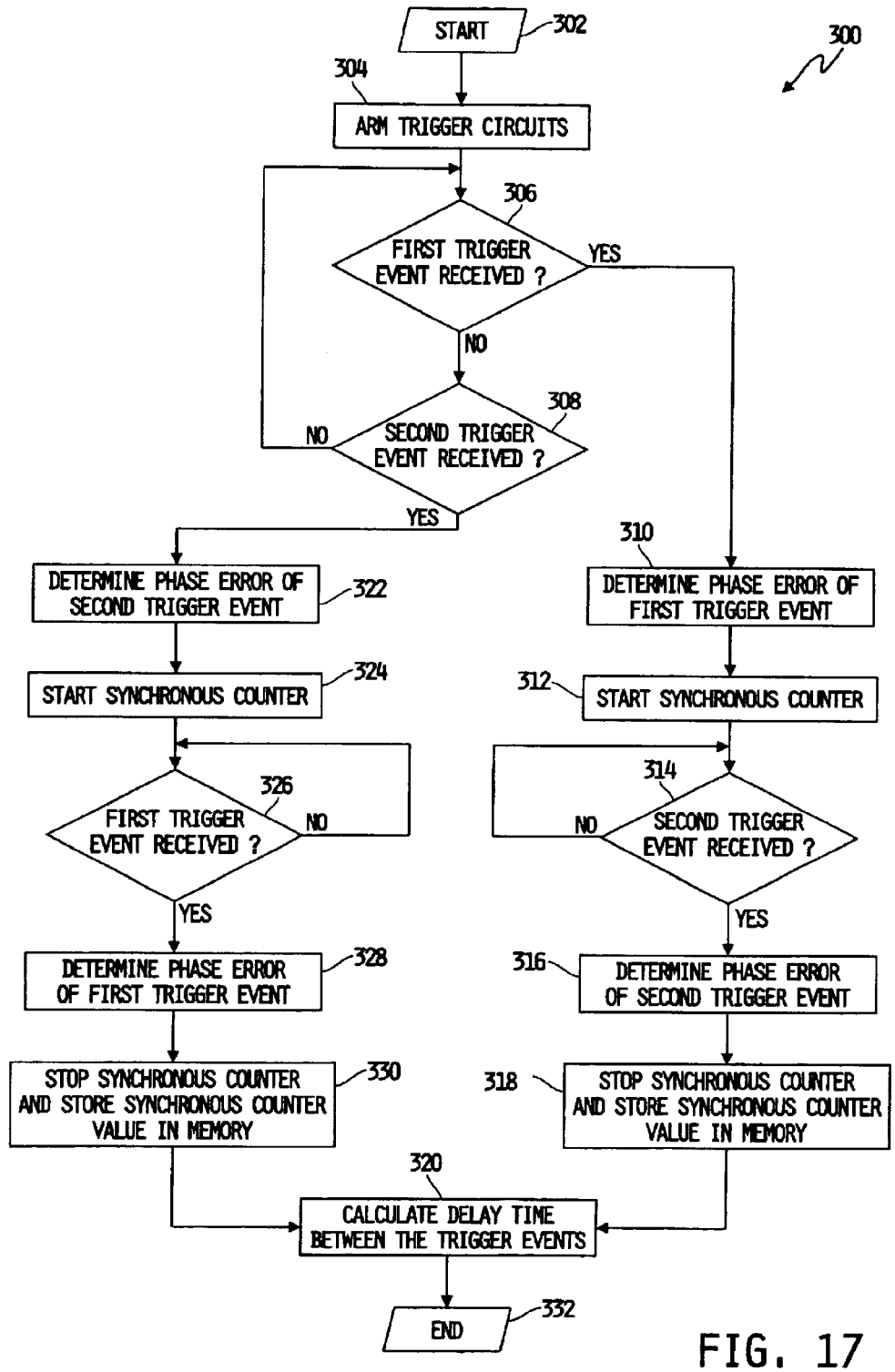
FIG. 17 illustrates a process flow diagram of a delay time measurement method of the circuit illustrated in FIG. 2.

Referring now to FIGS. 17 and 18, a system including two circuits 10 of the type illustrated in FIG. 1 may be used to measure the delay time between two input pulses utilizing a delay time measurement method or process 300. For example, a system having a first and a second illustrative circuit 30 may be used with the method 300. Although the method 300 is described below in reference to the circuit 30 which is one illustrative embodiment of the circuit 10, it should be appreciated that the method 300 is applicable to other embodiments of the circuit 10 as well. Additionally, in some embodiments, a single master clock circuit 12, 32 may be used in such systems.

The delay time measurement method 300 begins with a process step 302 in which the first and second circuits 30 are initialized. Initialization may include, for example, initializing the master clock circuit 32. An illustrative master clock pulse train 350 is shown in FIG. 18. In process step 304, the trigger circuits of the first and second circuits 30 are armed and prepared for the detection of trigger events. For example, the window voltages are determined and supplied to the Signal Conditioning and Edge Detection Circuits 34 of the first and second circuits 30 and the flip-flops of the Resynchronization and Jitter Pulse construction circuits 36 of the first and second circuits 30 are preset and armed.

In process step 306, the process 300 determines if a first trigger event 352 has been received by the first circuit 30. If the first circuit 30 received the first trigger event 352, the process 300 advances to process step 310 which will be described below. If the first circuit 30 did not receive the first trigger event 352, the process 300 determines if a second trigger event 354 has been received by the second circuit 30 in process step 208. If the second circuit 30 received the second trigger event 354, the process 300 advances to process step 322 which will be described below. If the second circuit 30 has not received the second trigger event 354, the process 300 loops back to process step 306 to determine if the first circuit 30 has received the first trigger event 352. Accordingly, the process 300 continues to monitor for one of the trigger events 352, 354 by advancing through the monitoring loop formed from the process steps 306 and 308.

Referring back to process step 306, if the first circuit 30 received the first trigger event 352 in process step 306, the phase error between the first trigger event 352 and the master clock pulse train 350 is determined in process step 310. Illustratively, the phase error is determined by initiating a first voltage ramp 356 contemporaneously with the detection of the first trigger event 352 at a time point 358. The first ramp 356 continues until a convenient leading edge of the master clock pulse train 350. Illustratively, the first ramp 356 continues for a time period equal to the phase error between the first trigger event 352 and the leading edge of the next cycle of the master clock pulse train 350 plus one additional clock cycle, i.e., a time point 360 at the rising edge of the second master clock cycle after the detection of the first trigger event 352. The time point 358 may or may not be synchronous with the detected first trigger event 352 due to inherent delays within the circuits 30. Similarly, the time point 360 may or may not be synchronous with the leading edge of the clock cycle of the master clock pulse train 350 due to inherent delays within circuits 30. However, the self-calibration method 230 may be used to compensate for the inherent delays of the circuits 30 as discussed above in regard to FIGS. 15 and 16.

After the first ramp 356 has stopped rising at the time point 360, the voltage value of the ramp 356 is digitized and the digital value is stored in a memory location. Illustratively, the voltage value of the ramp 356 is digitized by the ADC 88 (see FIG. 7) of the TVC and ADC circuit 38 and stored in the Memory Storage and Delay Calculation circuit 40 (see FIG. 8). In process step 312, a synchronous counter, illustrated in FIG. 18 by synchronous counter 368, is initiated to count the number of elapsed master clock cycles. Illustratively, the synchronous counter 368 is initiated at the rising edge of the second master clock cycle after the first trigger event 352 and contemporaneously with the time point 362. In process step 314, the process 300 monitors for the second trigger event 354. If the second circuit 30 has not received the second trigger event 354, the process 300 loops back to process step 314 to continue monitoring for the second trigger event 354. If the second circuit 30 has received the second trigger event 354, the phase error between the second trigger event 354 and the master clock pulse train 350 is determined in process step 316. Illustratively, the phase error is determined by initiating a second voltage ramp 362 contemporaneously with the detection of the second trigger event 354 at a time point 364. The second ramp 362 continues until a convenient leading edge of the master clock pulse train 350. Illustratively, similar to the first ramp 356, the second ramp 362 continues for a time period equal to the phase error between the second trigger event 354 and the leading edge of the next cycle of the master clock pulse train 350 plus one additional clock cycle, i.e., a time point 366 at the rising edge of the second master clock cycle after the detection of the second trigger event 354. The time point 364 may or may not be synchronous with the detected second trigger event 354 due to inherent delays within the circuits 30. Similarly, the time point 366 may or may not be synchronous with the leading edge of the clock cycle of the master clock pulse train 350 due to inherent delays within circuits 30. Again, the self-calibration method 230 may be used to compensate for the inherent delays of the circuits 30 as discussed above in regard to FIGS. 15 and 16.

After the second ramp 362 has stopped rising at the time point 366, the voltage value of the ramp 362 is digitized and the digital value is stored in a memory location. Illustratively, the voltage value of the ramp 362 is digitized by the ADC 88 (see FIG. 7) of the TVC and ADC circuit 38 and stored in the Memory Storage and Delay Calculation circuit 40 (see FIG. 8). In process step 318, the synchronous counter is terminated and the value of the synchronous counter is stored in a memory location. Illustratively, the synchronous counter is terminated contemporaneously with the time point 366 at the rising edge of the second master clock cycle after the second trigger event 354. The time value of the synchronous counter is stored in the Memory Storage and Delay Calculation circuit 40. The process 300 subsequently advances to process step 320 which will be described below.

Referring back to process step 308, if the second circuit 30 received the second trigger event 354 in process step 308, the process 300 performs a process routine formed of process steps 322–330 which is similar to the respective process steps of 310–318. The process routine of process steps 322–330 and process steps 310–318 differ in that the second voltage ramp 362 is initiated prior to the first voltage ramp 356 because the second trigger event 354 is received prior to the first trigger event 352. Additionally, in the process routine of process steps 322–330, the synchronous counter is initiated at the termination of the second ramp 362 and is halted at the termination of the first ramp 356. However, the calculation process of the phase error of the trigger events 352, 354 is similar in both process routines. Accordingly, the process 300 operates in substantially the same manner independent of whether the first trigger event 352 occurs before or after the second trigger event 354.

In process step 320, after both triggering events 352, 354 have been received in any order either through the process routine of process steps 310–318 or the process routine of process steps 322–330, the delay time between the two triggering events 352, 354 is calculated by the process 300. Illustratively, the delay time between the two trigger events 352, 354 is calculated by summing the value of the synchronous counter with the time value of the voltage ramp associated with the first received trigger event (i.e. the first voltage ramp 356 if the first trigger event 352 is received prior to the second trigger event 354 and the second voltage ramp 362 if the second trigger event 354 is received prior to the first trigger event 352). The time value of the voltage ramp associated with the second received trigger event (i.e. the second voltage ramp 362 if the first trigger event 352 is received prior to the second trigger event 354 and the first voltage ramp 356 if the second trigger event 354 is received prior to the first trigger event 352) is then subtracted from this sum. The resulting value, therefore, is the delay time between the first received trigger event and the second received trigger event. The time value of the digitized voltage ramp values may be determined by using the calibration coefficients determined by the self-calibration method 230 described above in regard to FIGS. 15 and 16. The process 300 subsequently terminates in process step 332.

It should be appreciated that the delay time calculation process of process step 320 may be configured or otherwise altered to accommodate other timing factors including, but not limited to, fixed and known delays. Knowledge of the time delay between two trigger pulses may have many applications including, for example, measuring the propagation delay in electrical circuitry, RADAR, control circuits, and distance measurement circuitry.

There are many advantages of the concepts of the present disclosure arising from the various features of the apparatus and methods described herein. Other embodiments of the apparatus and methods of the present disclosure may not include all of the features described yet still benefit from at least some of the advantages of such features. Those of ordinary skill in the art may readily devise their own implementations of the apparatus and methods of the present disclosure that incorporate one or more of the features of the present disclosure and fall within the spirit and scope of the invention defined by the appended claims.

What is claimed is:

1. An apparatus comprising
a clock for producing regular clock pulses;
a voltage converter for producing a voltage that is directly proportional to the difference between a triggering pulse and a clock pulse;
an analog-to-digital converter for converting a voltage produced by the voltage converter to a digital value; and
a summing circuit coupled to the analog-to-digital converter for producing a signal related to the sum of (i) a first time related to a predetermined number of clock pulses and (ii) a second time related to the digital value.

2. The apparatus of claim 1, wherein the voltage converter for producing a voltage that is directly proportional to the difference between a triggering pulse and a clock pulse comprises a voltage converter for producing a voltage that is directly proportional to the difference between a triggering pulse and a subsequent clock pulse.

3. The apparatus of claim 1, wherein the summing circuit coupled to the analog-to-digital converter for producing a signal related to the sum of (i) a first time related to a predetermined number of clock pulses and (ii) a second time related to the digital value comprises a summing circuit coupled to the analog-to-digital converter for producing a signal related to the sum of (i) a first time that is identifiable by counting a predetermined number of clock pulses and (ii) a second time related to the digital value.

4. The apparatus of claim 1, wherein the summing circuit coupled to the analog-to-digital converter for producing a signal related to the sum of (i) a first time related to a predetermined number of clock pulses and (ii) a second time related to the digital value comprises a summing circuit coupled to the analog-to-digital converter for producing a signal related to the sum of (i) a first time related to a predetermined number of clock pulses and (ii) a second time that is identifiable by converting the digital value to an analog value followed by converting the analog value to a time value.

5. The apparatus of claim 1, wherein the summing circuit coupled to the analog-to-digital converter for producing a signal related to the sum of (i) a first time related to a predetermined number of clock pulses and (ii) a second time related to the digital value comprises a summing circuit coupled to the analog-to-digital converter for producing a signal related to the sum of (i) a first time related to a predetermined number of clock pulses and (ii) a second time related to the phase error between a leading edge of a clock pulse and the triggering pulse.

6. The apparatus of claim 1, further including a memory circuit coupled to the analog-to-digital converter and the summing circuit, the memory circuit having a memory register capable of storing the digital value.

7. The apparatus of claim 6, wherein the memory circuit comprises a field-programmable gate array.

8. The apparatus of claim 6, further including a digital-to-analog converter for representing the digital value as an analog voltage, the digital-to-analog converter coupled to the memory circuit and the summing circuit.

9. The apparatus of claim 8, further including a time converter coupled to the digital-to-analog converter for representing the analog voltage as a time value.

10. The apparatus of claim 9, wherein the time converter comprise a voltage ramp generator.

11. The apparatus of claim 1, wherein the voltage converter comprises a voltage ramp generator.

12. The apparatus of claim 11, wherein the voltage converter further comprises a sample-and-hold circuit, a voltage comparator, and a sampling amplifier.

13. The apparatus of claim 11, wherein the voltage converter further comprises a control circuit for controlling the quiescent current of the voltage ramp generator.

14. The apparatus of claim 1, wherein the summing circuit comprises a plurality of delay generator devices.

15. The apparatus of claim 1, wherein the summing circuit comprises a voltage ramp generator and a comparator, the comparator having a first input coupled to a reference voltage source and a second input coupled to an output of the voltage ramp generator.

16. The apparatus of claim 1, further comprising a field programmable gate array for identifying the first and the second times.

17. The apparatus of claim 16, further comprising a synchronization circuit coupled to the field programmable gate array for improving the synchronization of the outputs of the field programmable gate array.

18. The apparatus of claim 1, further comprising a logic converter circuit for convening a signal from a first logic family to a second logic family.

19. A method for generating delayed events, the method comprising
   representing the time between a triggering pulse and a subsequent clock pulse as a voltage;
   converting the voltage to a stored digital value; and
   defining a desired delay time following the triggering pulse by (i) identifying a first time and (ii) adding to the first time a second time determined by converting the stored digital value to an analog value and converting the analog value to a time value.

20. The method of claim 19, wherein identifying a first time comprises identifying a time determined by counting a predetermined number of clock cycles.

21. The method of claim 19, wherein identifying a first time comprises retrieving a stored digital time value, the stored digital time value representing a predetermined number of clock cycles.

22. The method of claim 19, wherein representing the time between a triggering pulse and a subsequent clock pulse as a voltage comprises initiating a ramp voltage for the duration of the time between the triggering pulse and the subsequent clock pulse.

23. The method of claim 19, wherein converting the voltage to a stored digital value comprises (i) converting the voltage to a digital value and (ii) storing the digital value in a memory device.

24. The method of claim 19, wherein converting the stored digital value to an analog value and converting the analog value to a time value comprises initiating a ramp voltage for a duration until the ramp voltage is substantially equal to the analog value.

25. The method of claim 24, wherein initiating a ramp voltage for a duration until the ramp voltage is substantially equal to the analog value comprises holding the ramp voltage at a voltage substantially equal to the analog value.

26. The method of claim 25, wherein holding the ramp voltage at a voltage substantially equal to the analog value comprises controlling the quiescent current of a ramp generator.

27. The method of claim 26, wherein controlling the quiescent current of a ramp generator comprises reducing the quiescent current towards zero amps.

28. The method of claim 19, further comprising defining a desired pulse width by (i) identifying a third time and (ii) adding to the third time a fourth time determined by converting the stored digital value to an analog value and converting the analog value to a time value.

29. The method of claim 28, wherein identifying a third time comprises identifying a time determined by counting a predetermined number of clock cycles.

30. The method of claim 28, wherein identifying a third time comprises retrieving a stored digital time value, the stored digital time value representing a predetermined number of clock cycles.

31. The method of claim 28, further comprising producing an output trigger event a duration after the trigger pulse, the duration being substantially equal to the desired delay time, the output trigger event having a duration substantially equal to the desired pulse width.

32. The method of claim 19, further comprising converting the stored digital value to a leading edge value.

33. The method of claim 32, wherein converting the stored digital value to a leading edge value comprises converting the stored digital value to a first time value, calculating a difference of a period of a master clock and the first time value, and converting the difference to a digital value.

34. Apparatus for generating a delayed event, the apparatus comprising
   first means for producing regular clock pulses;
   second means for producing a voltage that is proportional to the difference between a triggering pulse and a clock pulse;
   third means for converting a voltage produced by the second means to a digital value; and
   fourth means for producing a signal related to the sum of (i) a first time related to a predetermined number of clock pulses and (ii) a second time related to the digital value, the fourth means coupled to the third means.

35. The apparatus of claim 34, wherein the second means comprises second means for producing a voltage that is directly proportional to the time difference between a triggering pulse and a subsequent clock pulse.

36. The apparatus of claim 34, wherein the fourth means for producing a signal related to the sum of (i) a first time related to a predetermined number of clock pulses and (ii) a second time related to the storable digital value comprises fourth means for producing a signal related to the sum of (i) a first time that is identifiable by counting a predetermined number of clock pulses and (ii) a second time related to the storable digital value.

37. The apparatus of claim 34, wherein the fourth means for producing a signal related to the sum of (i) a first time related to a predetermined number of clock pulses and (ii) a second time related to the storable digital value comprises fourth means for producing a signal related to the sum of (i) a first time related to a predetermined number of clock pulses and (ii) a second time that is identifiable by converting the storable digital value to an analog value followed by converting the analog value to a time value.

38. The apparatus of claim 34, wherein the fourth means for producing a signal related to the sum of (i) a first time related to a predetermined number of clock pulses and (ii) a second time related to the storable digital value comprises fourth means for producing a signal related to the sum of (i) a first time related to a predetermined number of clock pulses and (ii) a second time related to the phase error between a leading edge of a clock pulse and the triggering pulse.

39. The apparatus of claim 34, further including fifth means for storing the storable digital value, the fifth means including a memory register, the fifth means coupled to the third means and the fourth means.

40. The apparatus of claim 39, wherein the fifth means comprises a field-programmable gate array.

41. The apparatus of claim 39, further including sixth means for representing the storable digital value as an analog voltage, the sixth means coupled to the fourth means and the fifth means.

42. The apparatus of claim 41, further including seventh means for representing the analog voltage as a time value, the seventh means coupled to the sixth means.

43. The apparatus of claim 42, wherein the seventh means comprise a voltage ramp generator.

44. The apparatus of claim 34, wherein the second means comprises a voltage ramp generator.

45. The apparatus of claim 44, wherein the second means further comprises a sample-and-hold circuit, a voltage comparator, and a sampling amplifier.

46. The apparatus of claim 44, wherein the second means further comprises a control circuit for controlling the quiescent current of the voltage ramp generator.

47. The apparatus of claim 34, wherein the fourth means comprises a plurality of delay generator devices.

48. The apparatus of claim 34, wherein the fourth means comprises a voltage ramp generator and a comparator, the comparator having a first input coupled to a reference voltage source and a second input coupled to an output of the voltage ramp generator.

49. The apparatus of claim 34, further comprising a field programmable gate array for identifying the first and the second times.

50. The apparatus of claim 49, further comprising a synchronization circuit coupled to the field programmable gate array for improving the synchronization of the outputs of the field programmable gate array.

51. The apparatus of claim 34, further comprising fifth means for converting a signal from a first logic family to a second logic family.

* * * * *